United States Patent [19]

Hori et al.

[11] Patent Number: 5,574,455
[45] Date of Patent: Nov. 12, 1996

[54] DIGITAL TO ANALOG CONVERTER AND FREQUENCY SYNTHESIZER USING THE CONVERTER

[75] Inventors: Kazuyuki Hori, Tokyo; Masaru Kokubo, Hannou, both of Japan

[73] Assignee: Hitachi, Ltd., Tokyo, Japan

[21] Appl. No.: 377,648

[22] Filed: Jan. 25, 1995

[30] Foreign Application Priority Data

Jan. 25, 1994 [JP] Japan ........................... 6-006130

[51] Int. Cl.[6] .......................... H03M 1/68; H03K 13/00
[52] U.S. Cl. ........................ 341/144; 341/143; 341/153
[58] Field of Search .................................. 341/143, 144, 341/153

[56] References Cited

U.S. PATENT DOCUMENTS

| | | | |
|---|---|---|---|
| 4,393,370 | 7/1983 | Hareyama | 340/347 |
| 4,910,514 | 3/1990 | Irmer et al. | 341/64 |
| 4,958,159 | 9/1990 | Wyatt | 341/144 |
| 5,146,224 | 9/1992 | Kitayoshi | 341/147 |
| 5,162,800 | 11/1992 | Ogawara | 341/144 |
| 5,181,034 | 1/1993 | Takakura et al. | 341/144 |
| 5,243,347 | 9/1993 | Jackson et al. | 341/144 |
| 5,245,593 | 9/1993 | Yamate | 368/156 |
| 5,446,457 | 8/1995 | Ryat | 341/136 |
| 5,453,743 | 9/1995 | Kang | 341/144 |

Primary Examiner—Brian K. Young
Assistant Examiner—Peguy JeanPierre
Attorney, Agent, or Firm—Antonelli, Terry, Stout & Kraus

[57] ABSTRACT

A digital to analog converter which includes a delta-sigma modulator for transforming the lower n bits of an input digital signal of N bits by delta-sigma modulation; first and second signal output devices for outputting first and second signals which are used for selecting current cells of a current cell array according to the higher bits and the higher bits+one LSB of the input digital signal, and a selector for selecting either of the first and second signals in accordance with the change of the output of the delta-sigma modulator. A filter is provided for smoothing the total of the currents output from the current cells which are in the output state corresponding to the first or second signal selected by the signal selector.

78 Claims, 12 Drawing Sheets

/ 5,574,455 /

DIGITAL TO ANALOG CONVERTER AND FREQUENCY SYNTHESIZER USING THE CONVERTER

BACKGROUND OF THE INVENTION

The present invention relates to a digital to analog converter for converting a digital signal to an analog signal. More particularly, the invention relates to a digital to analog converter suitable for obtaining high resolution, and a frequency synthesizer which uses the converter.

An example of a digital to analog converter which converts a digital signal to an analog signal is known as a digital to analog converter of a current cell matrix type. Such a converter uses current cells arranged in a matrix as disclosed in Japanese Patent Laid-Open No. 153832/1981. FIG. 13 is a block diagram showing the structure of a conventional digital to analog converter of a current cell matrix type.

The digital to analog converter of a current cell matrix type illustrated in FIG. 13 converts 6-bit digital signals to analog signals. The converter comprises a current cell array 401 made up of current cells 402 of an 8×8 matrix; and a first row decoder 403, a second row decoder 411, and a column decoder 406 which are used for selecting some of the current cells 402 in the current cell array 401.

The higher three bits of an input signal of six bits are supplied to the first row decoder 403 through signal lines 64 to 66. The output of the first row decoder 403 is supplied to the second row decoder 411 through signal lines 421 to 428. On the other hand, the lower three bits of the input signal of the six bits are supplied to the column decoder 406 through signal lines 61 to 63. The first row decoder 403 decodes the higher three bits of the input signal to generate first row selection signals RA0 to RA7, which are supplied to the current cell array 401 through signal lines 421 to 428, respectively.

The second row decoder 411 receives the output signals RA0 to RA7 from the first row decoder 401 to generate second row selection signals RR0 to RR7, which are supplied to the current cell array 401 through signal lines 431 to 438, respectively. The column decoder 406 decodes the lower three bits of the input signal to generate column selection signals CR0 to CR7, which are supplied to the current cell array 401 through signal lines 441 to 448, respectively.

In the current cell array 401, the common first row selection signals or the common second row selection signals are supplied to the current cells 402 belonging to the same column. Also, the common column selection signals are supplied to the current cells 402 belonging to the same column. The current cell 402 comprises, a switching circuit opened or closed in response to the first and second row selection signals and the column selection signals, and a current source. The output current of this current cell 402 can be taken out through a signal line 70 and the output signal lines 71 to 78 connected commonly to the current cells belonging to the same column.

Hereinafter, the description will be made of the operation of a digital to analog converter of a cell matrix type having such a structure by exemplifying a case where the digitally inputted signal represents "011111". When a 6-bit digital signal is inputted, the first row decoder 403 receives the higher three bits and activates one row selection signal RA3 of the first row selection signals RA0 to RA7 in accordance with the number "011" represented by the three bits. Also, the second row decoder 411 receives the first row selection signals RA0 to RA7, and activate the row selection signals RR0 to RR2 identical to the number "011" represented by the higher three bits of the input signal of six bits among the second row selection signals RR0 to RR7. Then column decoder 406 receives the lower three bits of the input signal of six bits, and activates the column selection signals CR0 to CR6 identical to the number "111" represented by the lower three bits of the input signal of six bits among the column selection signals CR0 to CR7.

The switching circuit of each current cell 402 receives these three kinds of selected signals. When the first row selection signal and column selection signal are both in the activated state or when the second row selection signal is in the activated, the switching circuit is closed and thereby, the current cell is made in an output state. In this example, the total of 31 current cells are in the output state: these are seven current cells belonging to the columns to which are connected the signal lines 441 to 447 in the row where the signal line 424 is connected, and 24 current cells belonging to the rows to which the signal lines 431 to 433 are connected.

It is conceivable to use a technique which uses a temporal interpolation in order to obtain a resolution higher than that of a digital to analog converter of this kind. For example, a signal is generated which repeats at a high speed a number "011111", and a number "100000" which is greater than the former number by 1. Then this signal is converted from digital to analog. The output of the digital to analog converter is smoothed by use of a filter having low-pass properties. In this way, it is possible to obtain the intermediate output value between the output value "011111" and the output value "100000", hence equivalently obtaining a resolution of seven bit by use of a six-bit digital to analog converter.

A technique which uses a delta-sigma modulation is shown in FIG. 14 as an example of obtaining a signal sequence for such a temporal interpolation. FIG. 14 is a block diagram showing an example of the structure of a digital to analog converter which uses digital-sigma modulation. In FIG. 14, a digital to analog converter having a 10-bit resolution uses a four-bit delta-sigma modulator (in FIG. 14, named a $\Delta\Sigma$ modulator) 100, a delay device 200, an adder 300, a six-bit digital to analog converter of current cell matrix type 400, and a low-pass filter 500. Hereunder, the description will be made of the operation of this digital to analog converter when a 10-bit signal 1 "0111110001" is inputted into the converter. of the input signal 1, the lower four-bit signal 3 representing "0001" is inputted into the delta-sigma modulator 100, and converted into one-bit signal 5. This one-bit signal 5 is a signal sequence comprising "0" and "1". Since this signal expresses one LSB in the case of a 4-bit resolution, "0" and "1" appear at a ratio of 15:1 in synchronism with a high sampling frequency of the delta-sigma modulator 100.

On the other hand, a six-bit signal 2 representing "011111" of the input signal 1 is delayed by the delay device 200 having stages the number of which is identical to the delay between the input and output of the delta-sigma modulator 100. After that, this signal is added by the adder 300 to the one-bit signal 5 from the delta-sigma modulator 100 However, if the six-bit signal 2 represents "111111", it is necessary to prohibit the addition in order to avoid overflow resulting from a carry. As the result of the addition by the adder 300, these signals become a six-bit signal sequence 6 in which the digital values "011111" and "100000" appear at a ratio of 15:1. This signal sequence 6 is converted into analog values by the six-bit digital-analog converter 400 of a current cell matrix type shown in FIG. 13 in detail. The output current 7 is converted into voltage by the lowpass filter 500, and the components of high frequency are removed, thus obtaining an analog output signal 8 having a resolution of 10 bits.

Now, in conjunction with FIG. 15 and FIG. 16, the description will be made of the operation of the digital to analog converter 400 of a current cell matrix type at that time. FIG. 15 and FIG. 16 are explanatory views illustrating an operation example of the digital to analog converter of a current cell matrix type shown in FIG. 13. The example shown in FIG. 15 illustrates schematically the output signals RA0 to RA7 and RR0 to RR7 of the first and second row decoders 403 and 411, the output signals CR0 to CR7 of the column decoder 406, and the states of the current cells of the current cell array 401 in FIG. 13 when the input digital signal represents "011111".

In FIG. 15, a reference numeral 174 denotes the status of the first row selection signal. It shows that only the output signal RA3 is active among the first row selection signals when the higher three bits of "011" are decoded by the first row decoder 403 shown in FIG. 13. A reference numeral 173 denotes the status of the second row selection signals. It shows that the RR0 to RR2 of the second row selection signals are active when the first row selection signals are decoded by the second row decoder 411 in FIG. 13. A reference numeral 175 denotes the status of the column selection signals. It shows that only the CR0 to CR6 are active among the column selection signals when the lower three bits of "111" are decoded by the column decoder 406 shown in FIG. 13.

In the current cell array 401, the current cells 171 are in the output state when the first row selection signals and column selection signals are activated, and the current cells 172 are in the output state when the second row selection signals are activated. Therefore, when the input digital signal is "011111", 31 current cells are in the output state.

The example shown in FIG. 16 schematically illustrates the output signals (RA0 to RA7, RR0 to RR7, and CR0 to CR7) of the decoders (first and second row decoders 403 and 411, and column decoder 406), and the states of the current cells 402 in FIG. 13 when the input digital signal represents "100000".

In FIG. 16, a reference numeral 177 denotes the status of the first row selection signal. It shows that only RA4 is active among the first row selection signals when the higher three bits of "100" are decoded by the first row decoder 403 in FIG. 13. Also, a reference numeral 178 denotes the status of the second row selection signals. It shows that the RR0 to RR3 of the second row selection signals are active when the first row selection signals are decoded by the second row decoder 411 in FIG. 13. Also, a reference numeral 179 denotes the status of the column selection signals. It shows that all the column selection signals are inactive when the lower three bits of "000" are decoded by the column decoder 406 in FIG. 13.

Of the current cell array 401, the current cells 176 are the current cells in the output state when the column selection signals are activated. Therefore, 32 current cells are in the output state when the input digital signal represents "100000".

The two kinds of input digital signals shown in FIG. 15 and FIG. 16 are repeated and the analog outputs of the input digital signals are smoothed. Thus it is possible to obtain a resolution which is higher than that which the digital to analog converter inherently has.

The digital to analog converter which utilizes the delta-sigma modulator is used for audio equipment, communication equipment, and the like. However, when such a conventional digital to analog converter of a current cell matrix type is used, glitches are generated because the row selection signals take wrong statues temporarily when the row selecting the input digital signal is changed and when temporary delay exists between the response of the first row decoder 403 and second row decoder 411 in FIG. 13. In the digital to analog converter which uses the delta-sigma modulator 100 as shown in FIG. 14, the row decoder operates along with the change of the output signals of the delta-sigma modulator 100 if the input digital signal of the digital to analog converter 400 of a current cell matrix type are a signal sequence in which the signal oscillate between "011111" and "100000" at a high speed. As a result, there arises a problem that a large number of glitches are generated as shown in FIG. 17.

FIG. 17 is a timing chart showing the timing status of the digital to analog converter of a current cell matrix type in FIG. 14. FIG. 17 illustrates the state in which a glitch is generated when the response of the second row decoder 411 shown in FIG. 13 is delayed by a period dt.

At the time t1, first, the activated states of the RA3 of the first row selection signals, and the column selection signals CR0 to CR6 are changed to the inactive states. Thus the selected state of the seven current cells 402 belonging to the current cells 171 in FIG. 15 is changed to the non-selected state. As a result, the output current out is decreased by a portion of 7LSBs. Next, at the time t2, the inactive state of the RR3 of the second row selection signals is changed to the activated state. Thus the non-selective state of the eight current cells controlled by the RR3 is changed to the active state. As a result, the output current Iout is increased by a portion of eight LSBs. At this time, the output current Iout is increased by one LSB from the initial state (at the time t1). However, a temporary erroneous operation during the period from t1 to t2 causes a glitch.

Therefore, a digital to analog converter of a current cell matrix type which uses a conventional delta-sigma modulator to enhance the resolution, suffers from the disadvantage that the signals for selecting current cells are generated along with the change in the output signals of the delta-sigma modulator, and if the operating time of each circuit which generates the signal for selecting current switch cells differs, a large number of glitches are generated.

SUMMARY OF THE INVENTION

It is an object of the present invention to provide a digital to analog converter capable of obtaining highly precise output signals by reducing the generation of glitches, and to provide a frequency synthesizer which uses the converter.

In order to achieve the above-mentioned object, a first embodiment of the digital to analog converter of the present invention comprises a delta-sigma modulator for transforming the lower n bits of an input digital signal of N bits to a one-bit signal sequence by delta-sigma modulation and for outputting the signal sequence; a first signal output device 10 for outputting a first signal used for selecting current cells corresponding to the higher (N-n) bits of the input digital signal; a second signal output device for outputting a second signal used for selecting current cells corresponding to a digital signal which differs from the higher (N-n) bits by one LSB; a signal selector circuit for selecting either of the first signal output from the first signal output device and the second signal output from the second signal output device in accordance with change of output from the delta-sigma modulator as the signal for selecting current cells; and a filter for smoothing the total of the output currents of the current cells of the current cell array being in the output state according to the first or second signal selected by the signal selector in accordance with the change in the output from the delta-sigma modulator 100.

A second embodiment of the digital to analog converter of the present invention comprises a delta-sigma modulator for transforming the lower n bits of an input digital signal of N bits to a one-bit signal sequence by delta-sigma modulation and outputting the one-bit signal sequence; a first row decoder for decoding the higher m bits of the higher (N-n) bits of an input digital signal and outputting a row selection signal for selecting one row in the current cell array corresponding to the number represented by the aforesaid m-bit signal; and a second row decoder for decoding the higher m bits and outputting a row output-state setting signal for bringing the current cells in all the rows of the current cell array corresponding to a number less than the number represented by the aforesaid higher m bits into an output state.

Further provided in the second embodiment is a first column decoder for decoding the lower (N-n-m) bits of the higher (N-n) bits of an input digital signal, outputting a column selection signal for selecting one column of the current cell array corresponding to the number represented by the aforesaid lower (N-n-m) bits, and bringing the current cells of the current cell array on the column selected by the aforesaid column selection signal and on the row selected by the row selection signal output by the first row decoder into the output state; and a second column decoder for decoding the lower (N-n-m) bits, outputting an all-column selection signal for selecting the current cells of all the columns of the current cell array corresponding to a number less than the number represented by the aforesaid lower (N-n-m) bits into the output state, and bringing the current cells of the current cell array on the columns selected by the aforesaid all-column selection signal and on the row selected by the row selection signal output by the first row decoder into the output state.

A selector is provided for controlling the input of the column selection signal output from the first column decoder to the current cell array in accordance with the activate state and inactivated state of the output of the delta-sigma modulator, and switching the output states of the corresponding current cells; and a filter is provided for smoothing the total of the output currents of the current cell array in the activate state and inactivate state of the delta-sigma modulator.

A third embodiment in the digital to analog converter of the present invention is the same as the second embodiment further comprising a synchronizing controller for synchronizing the input timing of the output signals from the first and second row decoders, and the first and second column decoders to the current cell array.

A fourth embodiment of the digital to analog converter of the present invention is the same as the first or the third embodiment further comprising a delay device for delaying the input of the higher (N-n) bits of the input digital signal for a period equal to the delay between the input and output of the delta-sigma modulator.

A fifth embodiment of the digital to analog converter of the present invention is the same as the first or the fourth embodiment wherein the filter is provided with a current to voltage converter for converting the output current from the current cell array to a voltage.

A sixth embodiment of the present invention provides a frequency synthesizer which includes a voltage controlled oscillator which provides oscillation output at a frequency corresponding to the inputted analog voltage value; a divider for frequency-dividing the output of the voltage controlled oscillator; a phase comparator for outputting a digital signal corresponding to the phase difference between the output of the divider and a reference signal; a digital filter for removing the unwanted high frequency components included in the output of the phase comparator; and a digital to analog converter corresponding to any one of the first to fifth embodiments described above for driving the voltage controlled oscillator by converting the output of the digital filter to an analog voltage.

According to the present invention, with the structure as in described with respect to the first embodiment, the selection signals of the current switch cells corresponding to the input digital signal and a digital signal which differs from the former input digital signal by one LSB (greater or smaller) are separately generated without influence of the change in the output of the delta-sigma modulator, and then, in accordance with the change in the output of the delta-sigma modulator, either one of the signals is selected in order to switch the selection of the current switch cells. In this way, it is possible to suppress the generation of glitches due to the difference in operating time between the selection signal generators, caused by the conventional technique that "the selection signals for selecting current cells corresponding to an input digital signal and a digital signal which differs from the former input digital signal by 1 LSB is alternately generated and inputted in order to switch the current switch cells".

In the second embodiment, while the second column decoder operates similarly to a conventional decoder, the first column decoder is adapted to select in advance a signal corresponding to the column to be newly selected by the second column decoder when the signal inputted into the column decoder is increased by one. Then the selector activates a signal corresponding to the signal activated by the second column decoder when the output of the delta-sigma modulator is "0". Also, if the output of the delta-sigma modulator is "1", the selector activates the column selection signal corresponding to the signals activated by the second column decoder and the first column decoder. In other words, by the output signal of the delta-sigma modulator the selector controls the determination whether or not the column selected by the first column decoder should be added to the column selected by the second column decoder. In this way, if the output of the delta-sigma modulator is "1", it is possible to select columns the number of which is one greater than the total number of columns selected when the output of the delta-sigma modulator is "0". In this case, the input of the row decoder has no relationship with the output of the delta-sigma modulator, thus preventing the glitches due to the row decoder of the conventional art.

In the third embodiment the delay in the response time of the first and second row and column decoders can be absorbed, hence making it possible to prevent the glitches from being generated due to the delay in response time of the decoders.

In the fourth embodiment it is possible to operate the first and second row and column decoders, and the selector in synchronism with each other.

In the fifth embodiment it is possible to produce the output voltage which corresponds to the input digital signal.

In the sixth embodiment the fluctuation of the frequency output from the frequency synthesizer can be reduced because it is possible to utilize the digital to analog converter whose resolution is enhanced.

BRIEF DESCRIPTION OF THE DRAWINGS

The present invention will be more apparent from the following detailed description, when taken in conjunction with the accompanying drawings, in which.

DESCRIPTION OF THE PREFERRED EMBODIMENTS

Hereinafter, in conjunction with the accompanying drawings, the description will be made of the embodiments according to the present invention.

Figure 1:
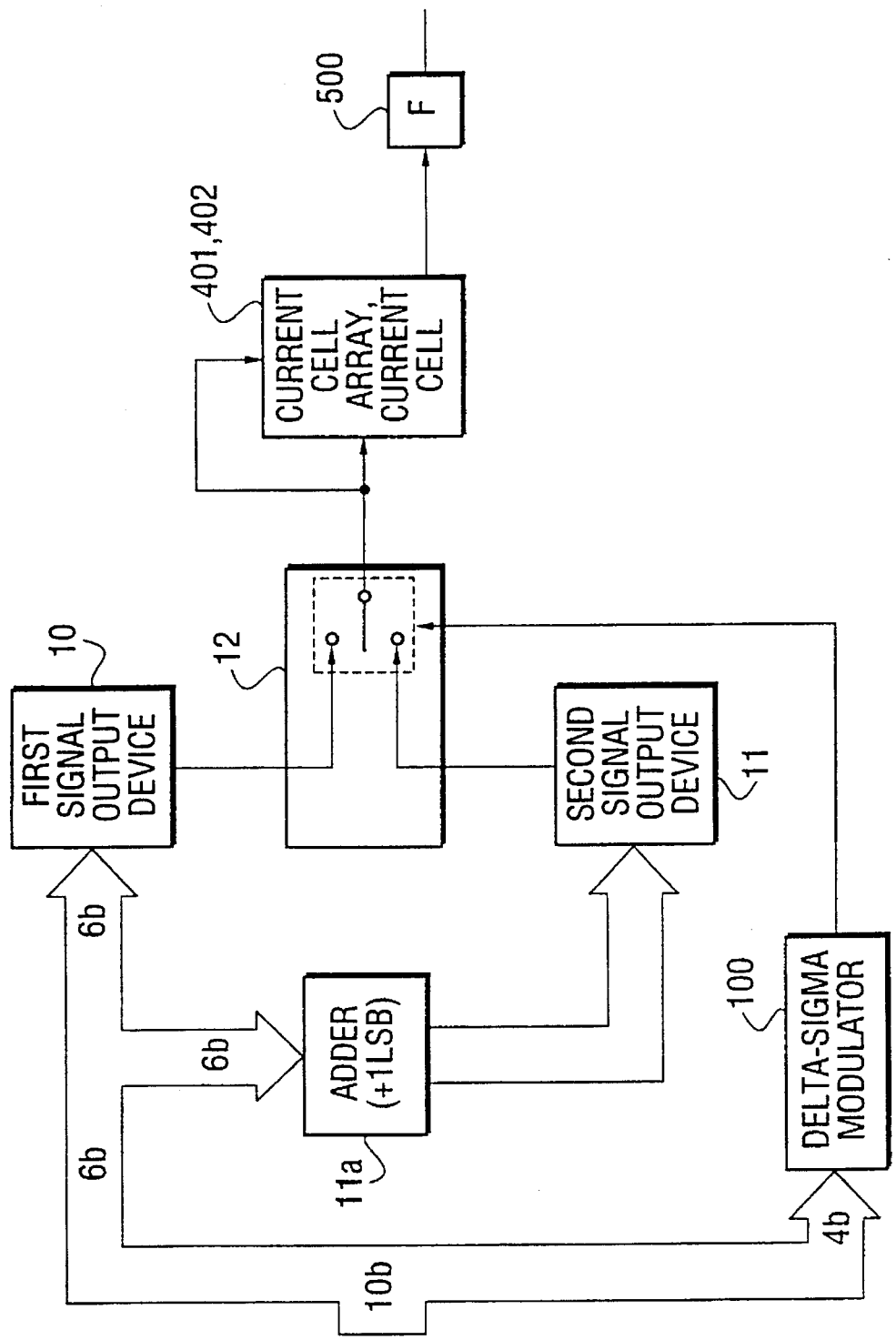
FIG. 1 is a block diagram showing a first embodiment of the structure of a digital to analog converter according to the present invention.

FIG. 1 is a block diagram showing a first embodiment of the structure of a digital to analog converter according to the present invention.

The digital to analog converter of the first embodiment is provided with a current cell array 401 comprising current sources arranged in a matrix and a plurality of current cells 402 including switches for taking out the current. Some of the current cells 402 are selected and brought into the output state according to an input digital signal of N bits in order to output the total of the output currents of the current cells in the output state. This digital to analog converter comprises a delta-sigma modulator 100 of the present invention, first and second signal output devices 10 and 11, a signal selector 12; an adder 11a, and a filter (designated by a reference symbol F in FIG. 1) 500.

The delta-sigma modulator 100 transforms the lower n bits of an input digital signal of N bits into a one-bit signal sequence by delta-sigma modulation and outputs the one-bit sequence. Also, the first signal output device 10 outputs the first signal which is used for the selection of current cells 402 corresponding to the higher (N-n) bits of the input digital signal. The adder 11a outputs the digital signal to the higher (N-n) bits to which one LSB is added. The second signal output device 11 outputs the second signal which is used for the selection of current cells 402 corresponding to the input digital signal from this adder 11a. Then the signal selector 12 selects either of the first signal output from the first signal output device 10 and the second signal output from the second signal output device 11 as a signal used for the selection of the current cells 402 in accordance with change in the output from the delta-sigma modulator 100. For example, if the output of the delta-sigma modulator 100 is "0", the first signal from the first signal output device 10 is selected If it changes to "1", the second signal from the second signal output device 11 is selected. As a result of this signal selection, the output current having a value corresponding to the higher (N-n) bits of the input digital signal, or the output current having a value corresponding to the signal produced by adding one LSB to the higher (N-n) bits of the input digital signal is outputted from the current cell array 401 along with the change in the output from the delta-sigma modulator 100. Both of the output currents thus output are smoothed by the filter 500.

As described above, in the digital to analog converter of the first embodiment, the selection signals of the current cells are generated separately by the first and second signal output devices 10 and 11 according to the input digital signal and the input digital signal which is greater than the former input digital signal by one LSB without being affected by the change in the output of the delta-sigma modulator 100. Thus each time the output of the delta-sigma modulator 100 changes, either of the selection signals is selected for switching the output the current of the current cell 402. In this way, it is possible to suppress the generation of glitches due to the difference in the operating time of each of the generators of the selection signals, the generation of glitches having been a problem in conventional apparatus.

Figure 2:
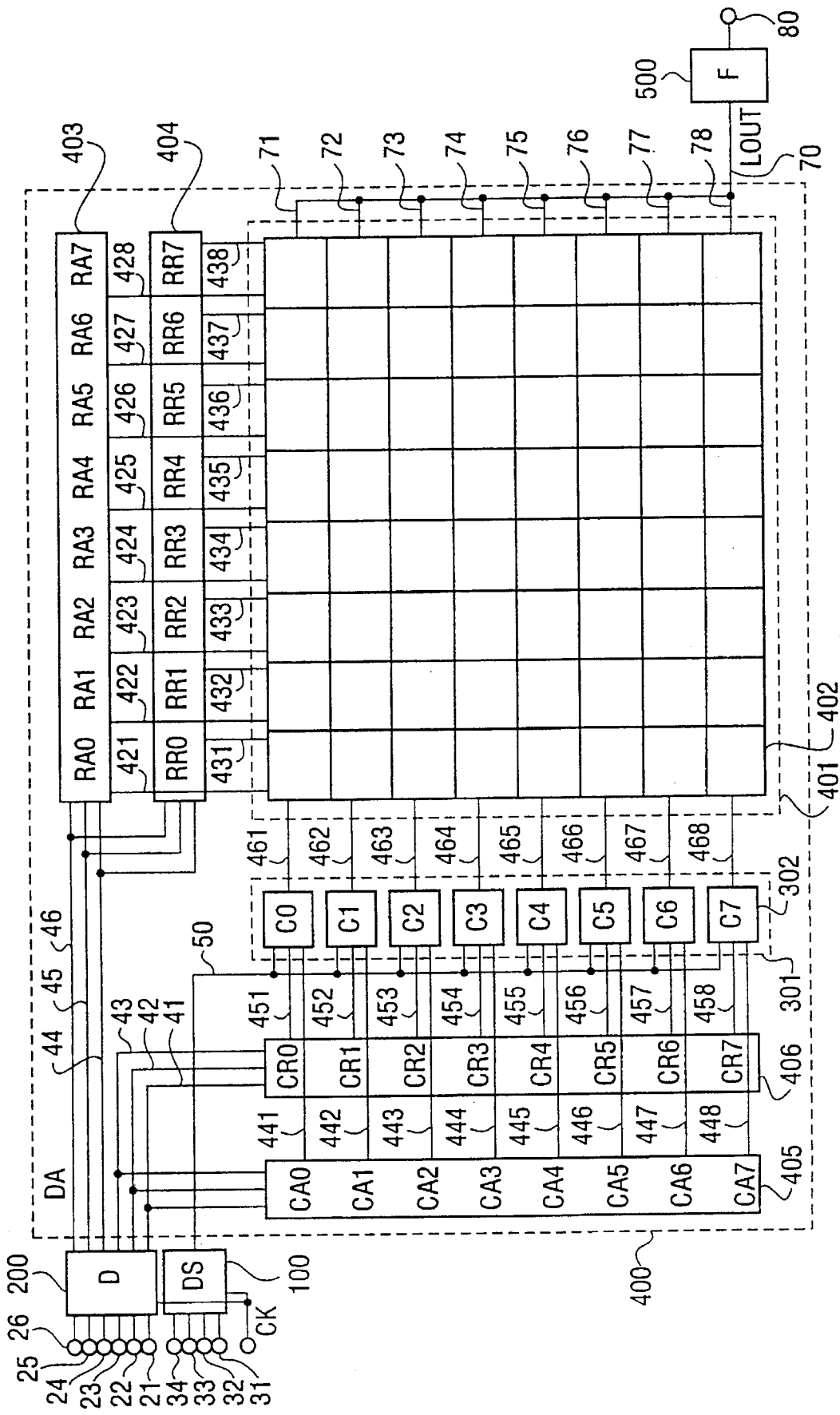
FIG. 2 is a block diagram showing a second embodiment of the structure of a digital to analog converter according to the present invention.

FIG. 2 is a block diagram showing a second embodiment of the structure of a digital to analog converter according to the present invention.

The second embodiment is an example in which a 10-bit circuit for digital to analog conversion includes a six-bit digital to analog converter of current cell matrix type (designated by DA in FIG. 2) 400, and comprises a delta-sigma modulator (designated by DS in FIG. 2) 100 for delta-sigma-modulating the lower four bits of an input digital signal of 10 bits; a delay device (designated by a reference symbol D in FIG. 2) 200 for delaying the higher six bits of the input digital signal; a first row decoder 403 for generating first row selection signals RA0 to RA7, and a second row decoder 404 for generating second row selection signals RR0 to RR7 by decoding the higher three bits of the output from the delay device 200; a first column decoder 405 for generating signals CA0 to CA7 and a second column decoder 406 for generating signals CR0 to CR7 by decoding the lower three bits of the output from the delay device 200; a selector apparatus 301 having a plurality of selectors 302 for generating column selection signals C0 to C7 by use of the signals CA0 to CA7, signals CR0 to CR7, and output signals DS from the delta-sigma modulator 100; a current cell array 401 made up of current cells 402; and a filter 500 for converting the output from the current cell array 401 to a voltage signal, and at the same time, removing the high frequency components included in the output current.

The lower four bits of a 10 bit digital signal are input to the terminals 31 to 34 while the higher six bits of the 10 bit digital signal are input to the terminals 21 to 26. Of these bits, the lower four bits input into the terminals 31 to 34 are input to the delta-sigma modulator 100. The output signal of the delta-sigma modulator is fed to the selector apparatus 301 comprising eight selectors 302 through a signal line 50.

The higher six bits of the 10 bit digital signal input to the terminals 21 to 26 are input into the delay device 200. The lower three bits of the output signal from the delay device 200 are fed to the first column decoder 405 and the second column decoder 406 through signal lines 41 to 43. The higher three bits are fed to the first row decoder 403 and the second row decoder 404 through signal lines 44 to 46.

The first column decoder 405 and the second column decoder 406 decode the lower three bits of the output signal from the delay device 200 to generate selection signals CA0 to CA7 and selection signals CR0 to CR7, respectively. The selection signals are fed to the selector 301 through the signal lines 441 to 448 and signal line 451 to 458, respectively. Each of the selectors 302 of the selector apparatus 301 receives the selection signals corresponding to the column to which the selector 302 belongs, and receives the output signal from the delta-sigma modulator 100. The column selection signals C0 to C7 output from the eight selectors 302 are fed to the current cell array 401 through the signal lines 461 to 468.

On the other hand, the first row decoder 403 and the second row decoder 404 decode the higher three bits of the output signal from the delay device 200 to generate the first row selection signals RA0 to RA7 and the second row selection signals RR0 to RR7. These first and second row selection signals are fed to the current cell array 401 through the signal line 421 to 428 and 431 to 438, respectively.

The current cells 402 in the current cell array 401, are each provided with a switch which is opened and closed in response to the first and second row selection signals, and column selection signals. The column selection signals, first and second row signals are commonly inputted into the input terminals for the column selection signals of the current cells 402 belonging to the same column, the input terminals for the first row selection signals of the current cells 402 belonging to the same row, and the input terminals for the second row selection signals of the current cells 402 belonging to the same row.

Further, the output currents from the current cells 402 are taken out through the signal line 70 and through the output signal lines 71 to 78 which are commonly connected to the current cells 402 belonging to the same column. Then, the currents from the current cells on signal line 70 is converted by the filter 500 into a voltage signal, and at the same time, the high frequency components included in the voltage signal are removed thereby.

Now, in conjunction with FIG. 3 to FIG. 8, the detailed description will be made of the structures of the delta-sigma modulator 100, the selectors 302, the current cells 402, and the filter 500, which constitute the digital to analog converter of the second embodiment described above.

Figure 3:
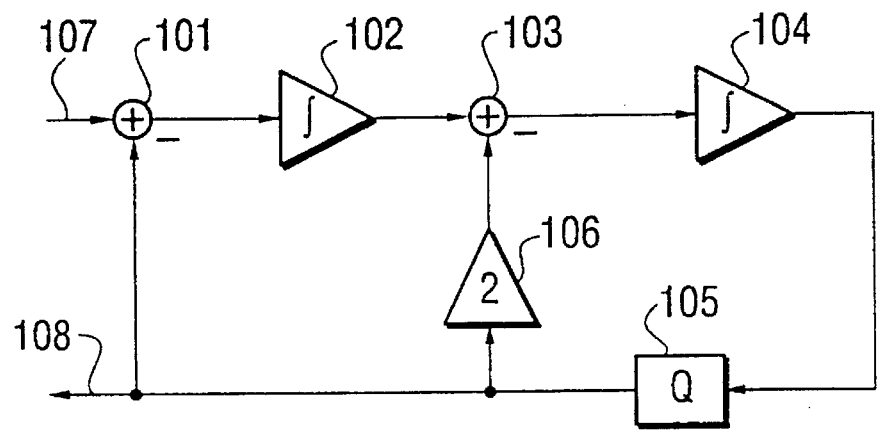
FIG. 3 is a circuit diagram showing an example of the structure a delta-sigma modulator shown in FIG. 2.

FIG. 3 is a circuit diagram showing an example of a structure of the delta-sigma modulator shown in FIG. 2. The circuit example of the delta-sigma modulator shown in FIG. 3 is a 2nd order delta-sigma modulator illustrated in the drawings (specifically FIG. 12) of Japanese Patent Laid-Open No. 500894/1993. This modulator comprises adders 101 and 103; a one-bit quantizer 105; a multiplier 106; and integrators 102 and 104. It is also provided with an input line 107 and an output line 108. A double closed loop is arranged so that the difference between the input signal and output signal is integrated by the integrator 102, and the difference between the output of the integrator 102 and the output signal is integrated by the integrator 104. Therefore, while the transfer function between the input and output becomes simply a delay, the quantization noises mixed in the output of the quantizer 105 are noise-shaped in order to reduce the noise components in the low frequency band while increasing the noise components in the high frequency band. The transfer function Hq(z) with respect to the noise components is expressed by the equation 1 as set forth below. The ultimately noise components in the high frequency band are removed by the lowpass filter.

$$Hq(z)=(1-z^{-1})^2 \qquad (1)$$

Figure 4:
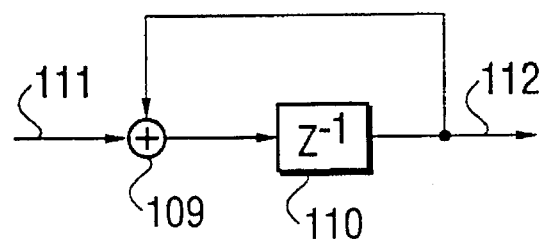
FIG. 4 is a circuit diagram showing an example of the structure of an integrator shown in FIG. 3.

FIG. 4 is a circuit diagram showing an example of the structure of the integrator of the delta-sigma modulator shown in FIG. 3. As shown in this example, the integrators 102 and 104 shown in FIG. 3 comprise an adder 109 and a delay device 110. It is also provided with input line 111 and output line 112. With the loops formed in the integrators which return the output signals to the input side, its gains are infinite in the case of direct current.

Figure 5:
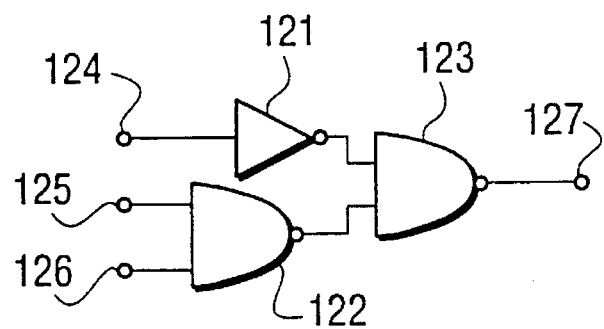
FIG. 5 is a circuit diagram showing an example of the structure of a selector shown in FIG. 2.

FIG. 5 is a circuit diagram showing an example of the structure of each of the selectors 302 shown in FIG. 2. As shown in FIG. 5, each of the selectors 302 in FIG. 2 comprises a NOT circuit (inverter) 121, and NAND circuits 122 and 123. It is also provided with input terminals 124, 125, and 126 into which the output signals are inputted from the second column decoder, first column decoder, and delta-sigma modulator, and an output terminal 127. With such a structure, each of the selectors 302 shown in FIG. 2 selects the output of the second column decoder 406 in FIG. 2, which is inputted to the input terminal 124 when the output of the delta-sigma modulator 100 in FIG. 2 represents "0". If the output of the delta-signa modulator 100 is "1", the selector 302 selects the output of the first column decoder 405 shown in FIG. 2, which is inputted into the input terminal 125. Also, if the output of the second column decoder 406 in FIG. 2, which is inputted to the input terminal 124, represents "1", the numeric value "1" is output forcedly.

Figure 6:
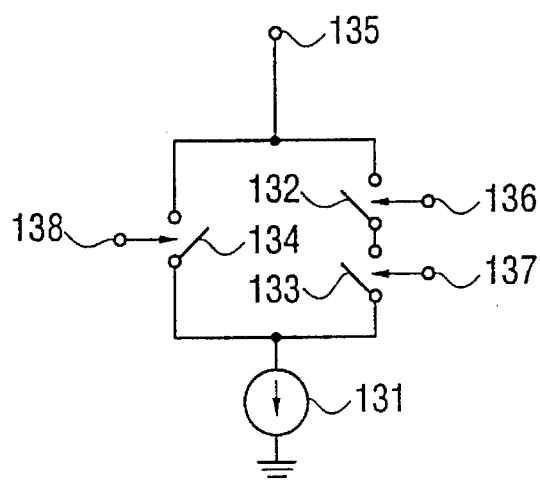
FIG. 6 is a circuit diagram showing an example of the structure of a current cell shown in FIG. 2.

FIG. 6 is a circuit diagram illustrating an example of the structure of a current cell 402 shown in FIG. 2. As shown in FIG. 6, the current cell 402 shown in FIG. 2 comprises a switching circuit having switches 132, 133, and 134, and a current source 131. To the control terminals 136, 137, and 138 of the switches 132, 133, and 134, the first row selection signal, the column selection signal, and the second row signal are inputted, respectively. The current of the current source 131 is supplied to the output terminal 135 when the switches 132 and 133 are both on, and when the switch 134 is on.

Figure 7:
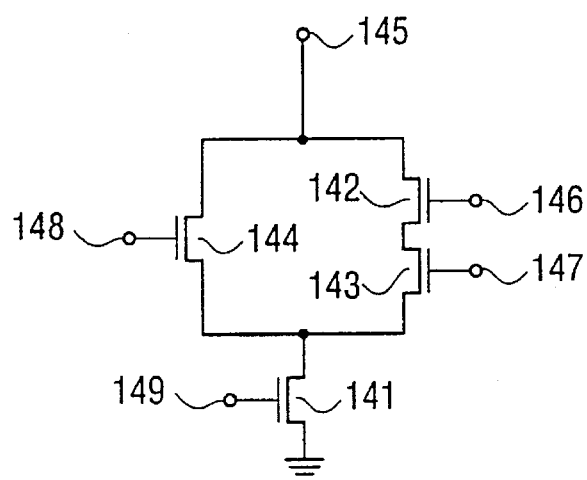
FIG. 7 is a circuit diagram showing an example of the structure in which a MOS transistor is used in the current switch cell shown in FIG. 2.

FIG. 7 is a circuit diagram showing an example of the structure in which a MOS transistor is used in the current cell shown in FIG. 2. The current cell of the embodiment comprises a switching circuit including MOS transistor 142, 143, and 144, and a current source 141 including a MOS transistor. To the gate terminals 146, 147 and 148 of the MOS transistors 142, 143, and 144, the first row selection signal, column selection signal, and second row selection signal are inputted. Also, to the gate terminal 149 of the MOS transistor 141, a bias voltage is applied to keep the current value as desired.

Figure 8:
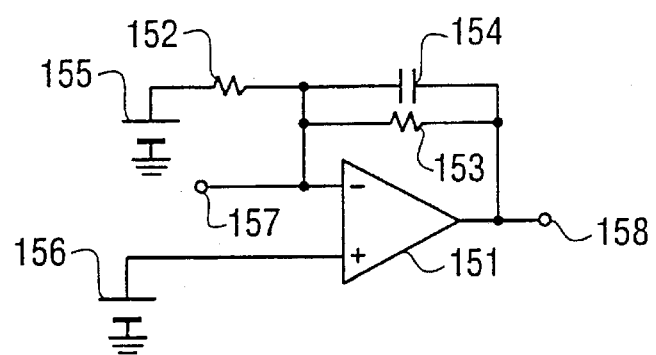
FIG. 8 is a circuit diagram showing an example of the structure of a filter shown in FIG. 2.

FIG. 8 is a circuit diagram showing an example of the structure of the filter shown in FIG. 2. The filter 500 shown in FIG. 2 is a lowpass filter comprising an operational amplifier 151; resistors 152 and 153; a capacitor 154; and reference voltage sources 155 and 156. To the terminal 157, the output current from the current cell array is inputted. The output signal is taken out from the terminal 158.

Now, in conjunction with FIG. 9 and FIG. 10, the description will be made of the operation of the digital to analog converter structured as shown in FIG. 2 in the case where the input digital signal represents "0111110001". In FIG. 2, the input signal of 10 bits is divided into the higher six bits and the lower four bits. The lower four bits are transformed by the delta-sigma modulator 100 into an oscillating waveform having "0" and "1". That is, in the waveform, "0" and "1" appear at a ratio of 15:1 as described before.

Figure 9:
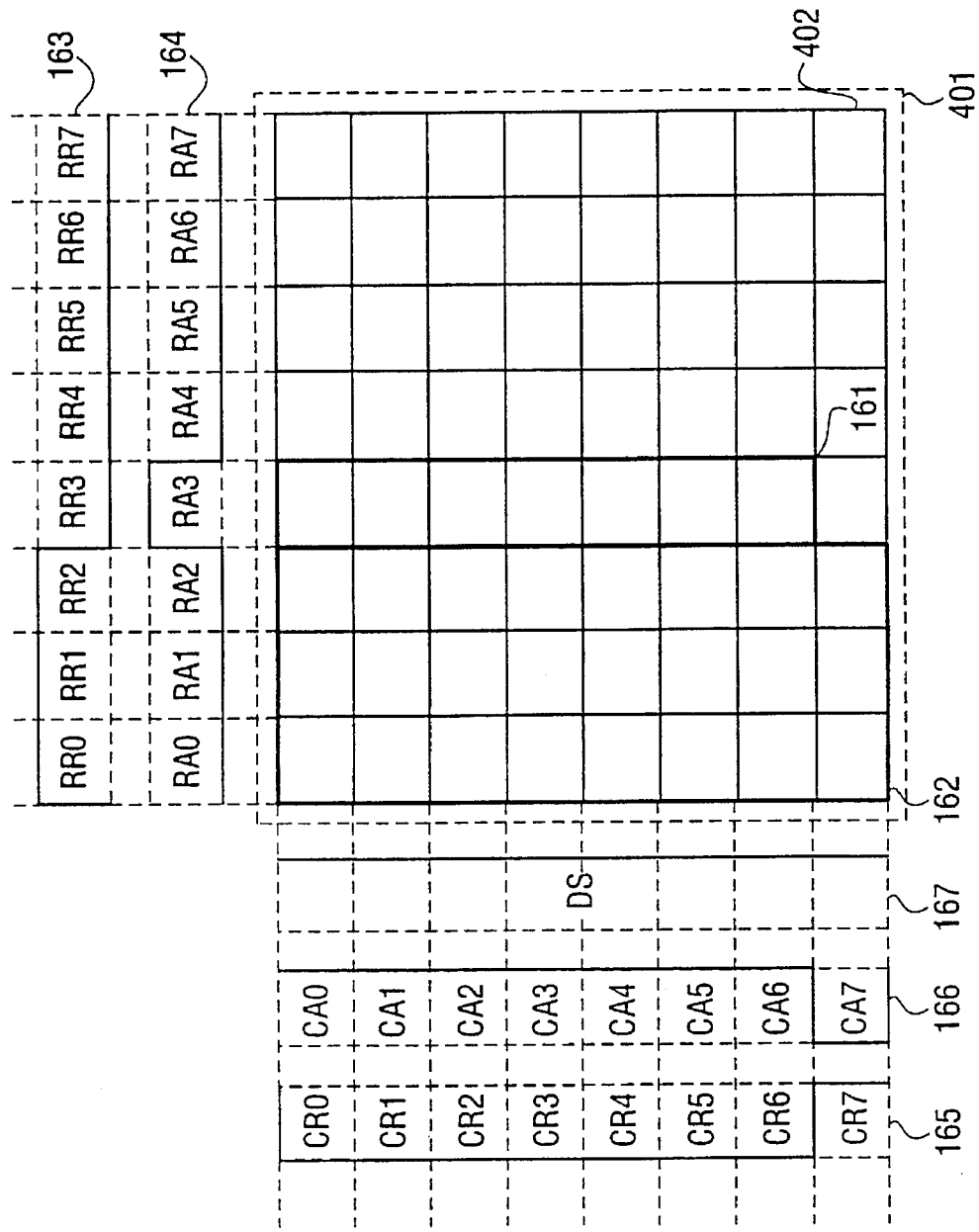
FIG. 9 is a view illustrating a first operation of the digital to analog converter of the present invention shown in FIG. 2.
Figure 10:
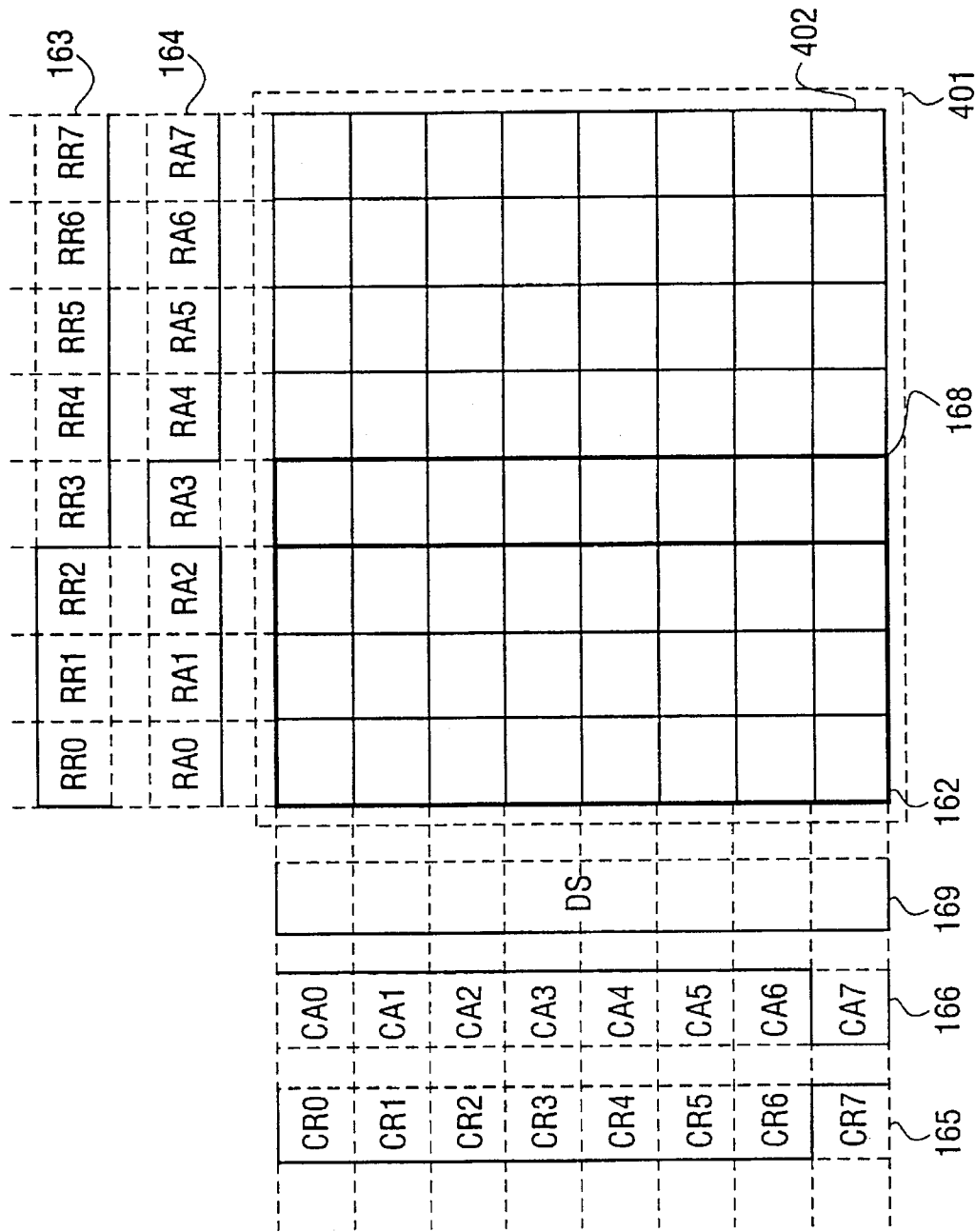
FIG. 10 is a view illustrating a second operation of the digital to analog converter of the present invention shown in FIG. 2.

FIG. 9 and FIG. 10 shows the output states of the decoders (the first and second row decoders 403 and 404, and the first and second column decoders 405 and 406) shown in FIG. 2, and the state of selection of the current cells. FIG. 9 illustrates the state when the delta-sigma modulator 100 shown in FIG. 2 outputs "0", while FIG. 10 illustrates the state when the delta-sigma modulator 100 shown in FIG. 2 outputs "1".

In FIG. 9 and FIG. 10, a reference numeral 162 designates the current cells 402 included in the current cell array 401 that are in the output state; 163, 164, 165, and 166 indicate the output states of the respective decoders (163 designates the second row decoder 404; 164, the first row decoder 403; 165, the second column decoder 406; and 166, the first column decoder 405 in FIG. 2). Also, in FIG. 9, a reference numeral 161 designates the current cells 402 included in the current cell array 401 that are in the output state; and 167 indicate the output state of the delta-sigma modulator 100 shown in FIG. 2. In FIG. 10, a reference numeral 168 designates the current cells 402 included in the current cell array 401 that are in the output state; and 169 indicates the output state of the delta-sigma modulator 100 shown in FIG. 2.

In FIG. 2, the higher six bits of the input signal of 10 bits are delayed by the delay device 200. In the second embodiment shown in FIG. 2, the number of stages of delay between the input and output of the delta-sigma modulator 100 is "2". Therefore, the number of stages of the delay device 200 is also to make the step number "2". Of the output from the delay device 200, only the RA3 out of the outputs RA0 to RA7 of the first row decoder 403, and only the RR0 to RR2 of the outputs RR0 to RR7 of the second row decoder 404 are activated by the higher bits "011". Also, only the CA7 out of the outputs CA0 to CA7 of the first column decoder 405 and only the CR0 to CR6 out of the outputs CR0 to CR7 of the second column decoder 406 are activated by the lower three bits "111". This decoding results in the output states 163 to of the decoders shown in FIG. 9.

The examples of the input and output characteristics of the first and second row decoders and the first and second column decoders are shown in Table 1 and Table 2, respectively.

TABLE 1

|  | Signal Name | Signal Line | |
|---|---|---|---|
|  | 1st bit | 46 | 00001111 |
|  | 2nd bit | 45 | 00110011 |
|  | 3rd bit | 44 | 01010101 |
| First Row Decoder | RA0 | 421 | 10000000 |
|  | RA1 | 422 | 01000000 |
|  | RA2 | 423 | 00100000 |
|  | RA3 | 424 | 00010000 |
|  | RA4 | 425 | 00001000 |
|  | RA5 | 426 | 00000100 |
|  | RA6 | 427 | 00000010 |
|  | RA7 | 428 | 00000001 |
| Second Row Decoder | RR0 | 431 | 01111111 |
|  | RR1 | 432 | 00111111 |
|  | RR2 | 433 | 00011111 |
|  | RR3 | 434 | 00001111 |
|  | RR4 | 435 | 00000111 |
|  | RR5 | 436 | 00000011 |
|  | RR6 | 437 | 00000001 |
|  | RR7 | 438 | 00000000 |

|  | Signal Name | Signal Line | |
|---|---|---|---|
|  | 1st bit | 41 | 00001111 |
|  | 2nd bit | 42 | 00110011 |
|  | 3rd bit | 43 | 01010101 |
| First Column Decoder | CA0 | 441 | 10000000 |
|  | CA1 | 442 | 01000000 |
|  | CA2 | 443 | 00100000 |
|  | CA3 | 444 | 00010000 |
|  | CA4 | 445 | 00001000 |
|  | CA5 | 446 | 00000100 |
|  | CA6 | 447 | 00000010 |
|  | CA7 | 448 | 00000001 |
| Second Column Decoder | CR0 | 451 | 01111111 |
|  | CR1 | 452 | 00111111 |
|  | CR2 | 453 | 00011111 |
|  | CR3 | 454 | 00001111 |
|  | CR4 | 455 | 00000111 |
|  | CR5 | 456 | 00000011 |
|  | CR6 | 457 | 00000001 |
|  | CR7 | 458 | 00000000 |

In FIG. 2, when the outputs from the first column decoder 405 and the delta-sigma modulator 100, which are the signals inputted into the selectors, are both in the active state or when the output of the second column decoder 406 is in the active state, each selector 302 of the selector apparatus 301 activates the corresponding column signals. Here, the output signal Ci from a selector 302 on a column i is expressed by equation 2 described below for the input signal CAi from the first column decoder 405, input signal CRi from the second column decoder 406, and input signal DS from the delta-sigma modulator 100.

$$Ci = CAi \cdot DS + CRi \qquad (2)$$

The input and output characteristics expressed by the equation 2 is shown in Table 3.

TABLE 3

| Signal Name | Signal line | |
|---|---|---|
| CRi | 124 | 00001 |
| CAi | 125 | 0101* (* = don't care) |
| DS | 126 | 0011* |
| Ci | 127 | 00011 |

Therefore, in this example (the higher six bits of the input signal is "011111"), and column selection signals C0 to C6 of the column selection signals C0 to C7 maintain its active state. The column selection signal C7 is in the active state when the output (DS) of the delta-sigma modulator 100 is "1" indicating an active state, and is in the inactive state when the output DS when is "0" indicating an inactive state.

The switching circuits of the current cells 402 receive these selection signals (RAi, RRi, and Ci) to bring the current cells 402 into the output state when the first row selection signals (RA0 to RA7) are in the active state, and also, the first and second column selection signals (CA0 to CA7 and CR0 to CR7) are in the active state or the second row selection signals (RR0 to RR7) are in the active state.

With such output states of the decoders, the current cells 402 designated by 161 of the current cell array 401 are in the output state as shown in FIG. 9 when the "RA3" of the first row selection signal 164 and the "CR0 to CR6" of the second column selection signal 165 are activated and when the output (DS) of the delta-sigma modulator is "0". Similarly, the current cells 402 designated by 162 are in the active state when the "RR0 to RR2" of the second row selection signal 163 are active. Thus the total of 31 current cells 402 are in the output state.

As shown in FIG. 10, when the output (DS) of the delta-sigma modulator 100 is "1", the current cells 402 designated by 168 of the current cell array 401 are in the output state by activating the "RA 3" of the first row selection signal 164, "CR0 to CR6" of the second column selection signal, and "CA7" of the first column selection signal. The current cells 162 are in the output state by activating the "RR0 to RR2" of the second row selection signal. Thus a total of 32 current cells are in the activated state.

Figure 14:
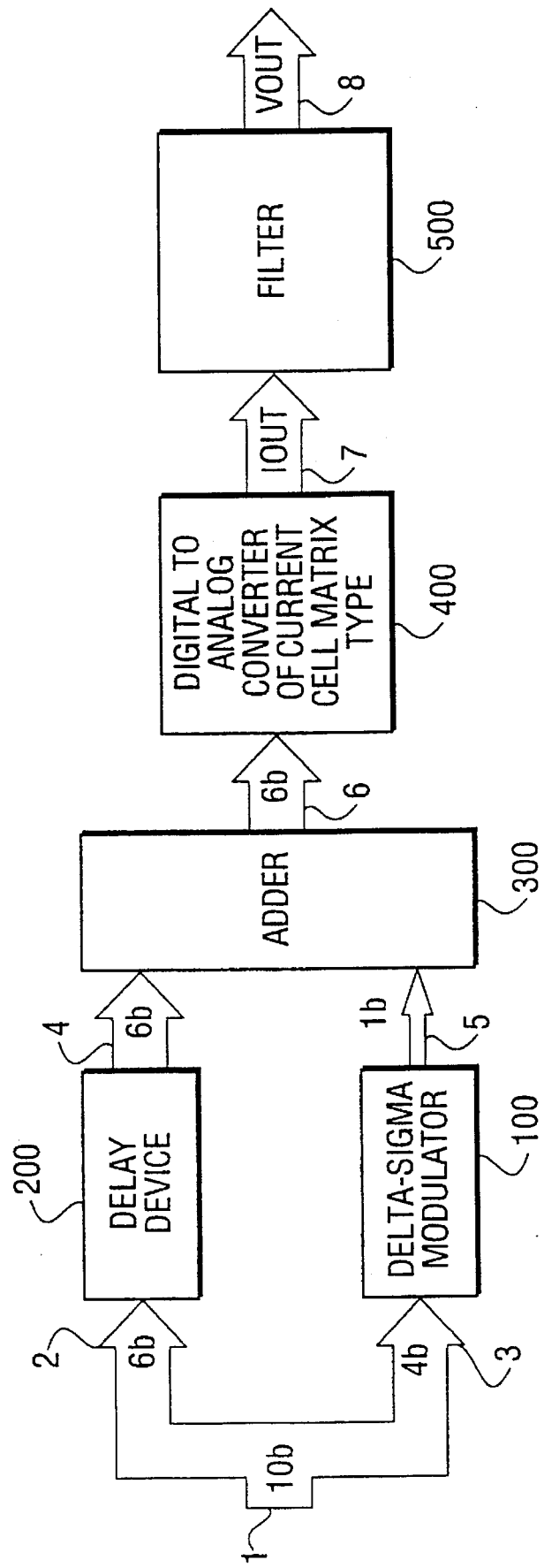
FIG. 14 is a block diagram showing an example of the structure of a digital to analog converter which uses a delta-sigma modulator.
Figure 15:
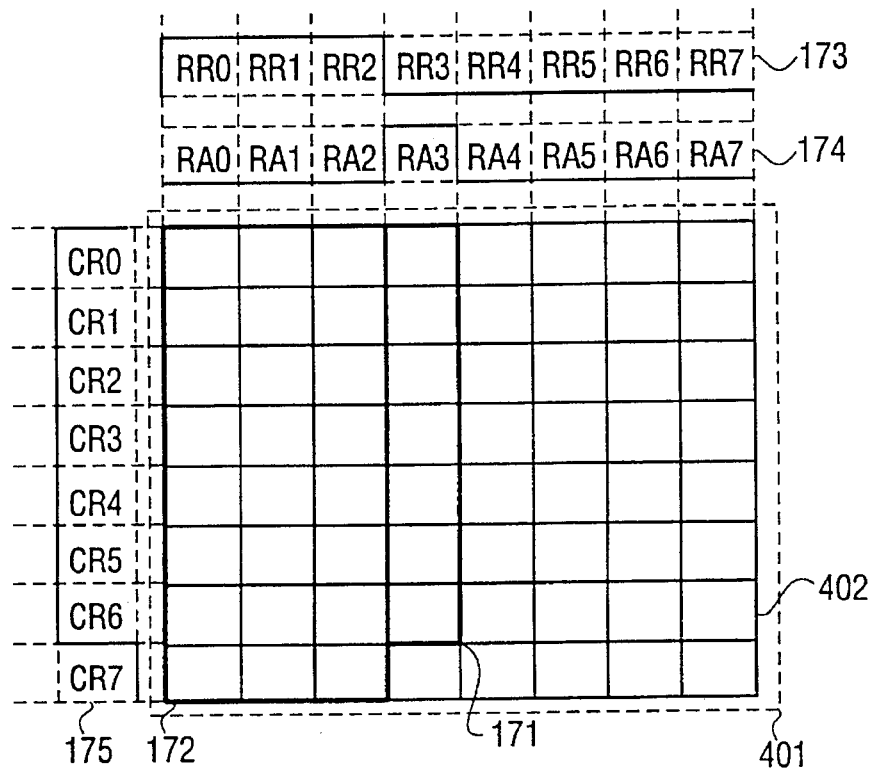
FIG. 15 is a view illustrating an example of the first operation of the digital to analog converter of a current cell matrix type shown in FIG. 13.
Figure 16:
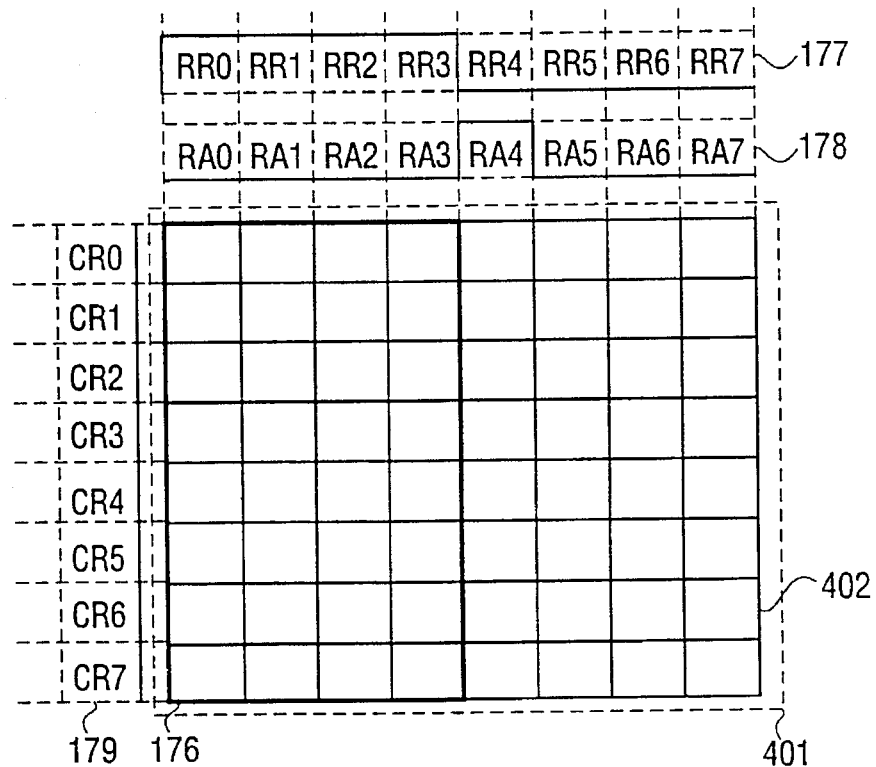
FIG. 16 is a view illustrating an example of the second operation of the digital to analog converter of a current cell matrix type shown in FIG. 13.
Figure 17:
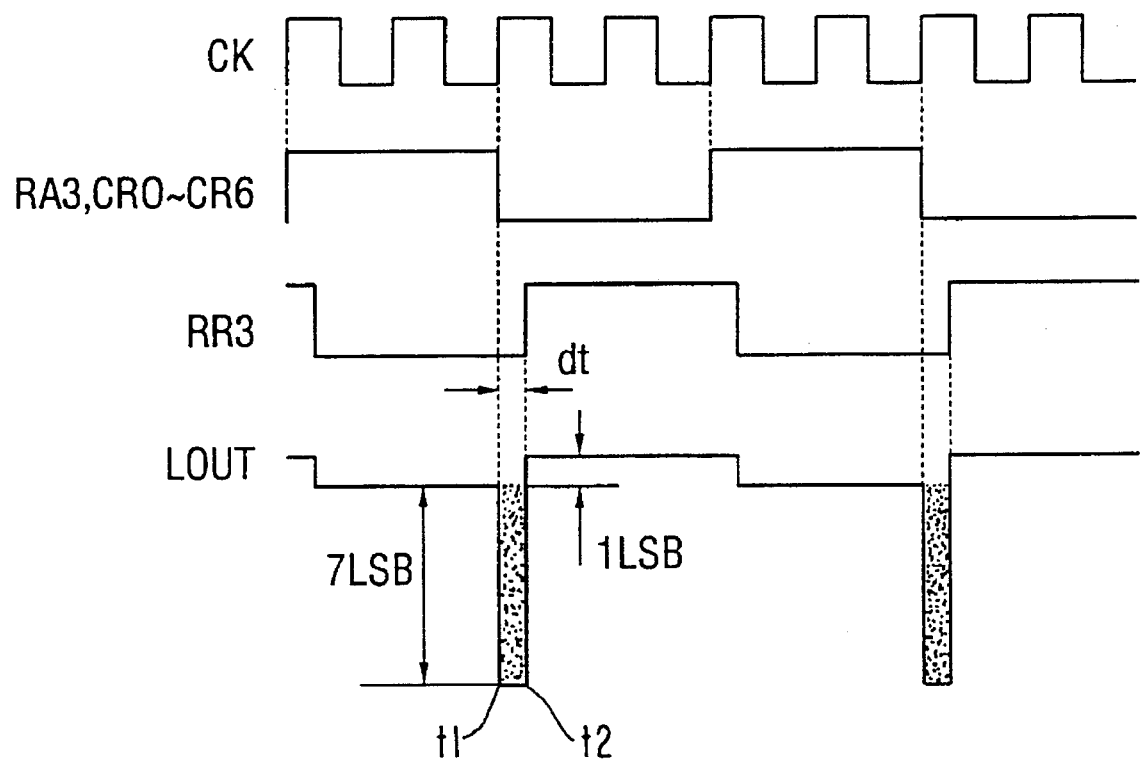
FIG. 17 is a timing chart showing the state of timing of the digital to analog converter of a current cell matrix type shown in FIG. 14.

In this way, the output current of the delta-sigma modulator when the output (DS) is "1" is one LSB greater than the output current of the delta-sigma modulator when the output (DS) is "0". Hence in the digital to analog converter which utilizes a delta-sigma modulator illustrated in the conventional technique shown in FIG. 14, a function equivalent to the result obtainable by the digital to analog conversion when "1" is added to the higher bits of a input digital signal is realized. In this case, change of the output (DS) of the delta-sigma modulator does not cause any change in the outputs "RA0 to RA7" and "RR0 to RR7" of the first row decoder 403 and second row decoder 404. Therefore, it is possible to suppress generation of glitches even when the response time is delayed between the first row decoder 403 and second row decoder 404.

According to the structure shown in FIG. 2, it is conceivable that the response time is delayed between the first row decoder 403 and second row decoder 404. As a result, glitches may be generated when the outputs "RA0 to RA7" and "RR0 to RR7" of the first and second row decoders 403 and 404 are changed due to change of the signal of the higher six bits of an input digital signal. Hereinafter, in conjunction with FIG. 11, the description will be made of an embodiment for coping with such a problem.

Figure 11:
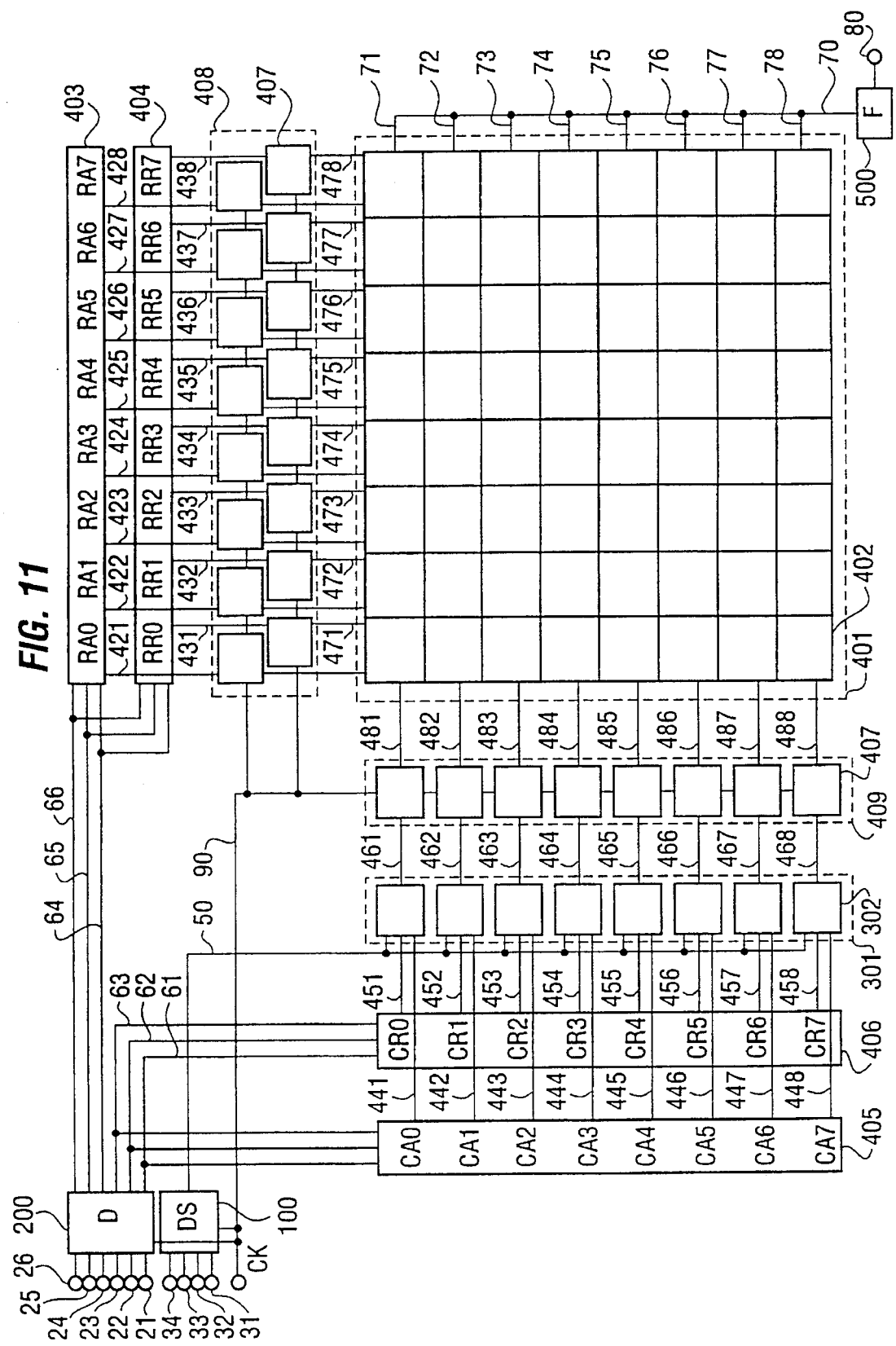
FIG. 11 is a block diagram showing a third embodiment of the structure of a digital to analog converter according to the present invention.

FIG. 11 is a block diagram showing a third embodiment of the structure of a digital to analog converter according to the present invention. The structure of the embodiment is such that latch circuit 408 and latch circuit 409 comprising latches 407, respectively, are inserted between the first and second row decoders 403 and 404, and the current cell array 401, and between the selectors 301 and the current cell array 401 which constitute the structure of the second embodiment shown in FIG. 2. By these latch circuits 408 and 409, delays in response time in the first and second row decoders 403 and 404 can be absorbed, such that the glitches generated when the outputs "RA0 to RA7" and "RR0 to RR7" of the first and second low decoders 403 and 404 are changed due to change of signal of the higher six bits of a digitally inputted signal are reduced.

Figure 12:
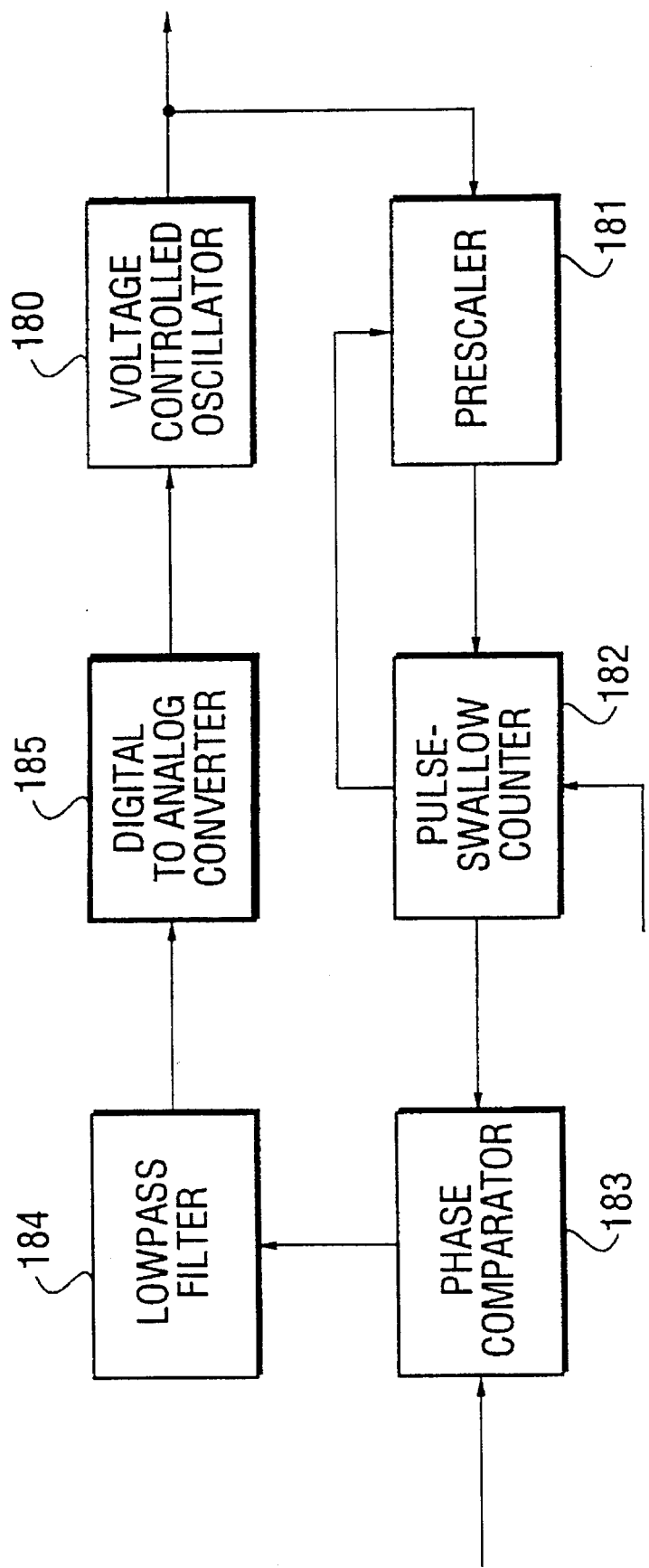
FIG. 12 is a block diagram showing an embodiment of a frequency synthesizer which uses the digital to analog converter of the present invention.
Figure 13:
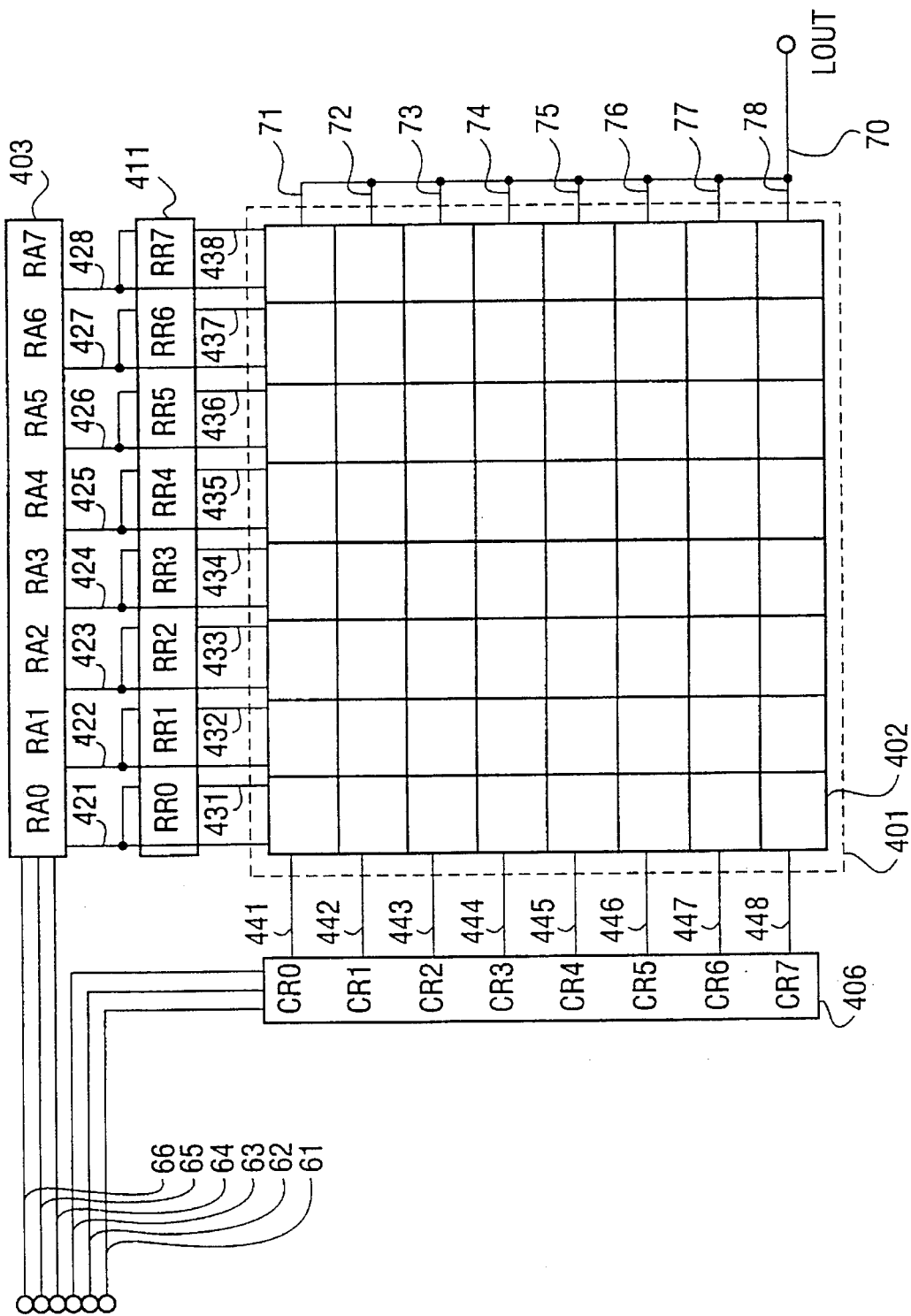
FIG. 13 is a block diagram showing the structure of the conventional digital to analog converter of a current cell matrix type.

Now, an example will be described, in which each of the first to third embodiments of the analog converters of the present invention are applied to frequency synthesizers. FIG. 12 is a block diagram showing an embodiment of a frequency synthesizer which uses a digital to analog converter of the present invention.

This example shows a basic structure of a PLL frequency synthesizer which uses a digital phase comparison method. This Phase Locked Loop (PPL) frequency synthesizer having a voltage controlled oscillator 180 for outputting an oscillated signal at a frequency corresponding to the inputted value of an analog voltage; a prescaler 181 and a pulse counter 182 constituting a programmable divider which divides the frequency of the output of the voltage controlled oscillator 180; a phase comparator 183 for outputting a digital signal corresponding to the phase difference between the output of the pulse counter 182 and a reference signal; a lowpass filter (digital filter) 184 for removing the unwanted high-frequency components included in the output of the phase comparator 183; and a digital to analog converter 185 for converting the output from the lowpass filter 184 to an analog voltage signal in order to drive the voltage controlled oscillator 180.

With such a structure, the frequency synthesizer can control the oscillation frequency by changing the divisor of the pulse counter 182 from outside. When the voltage controlled oscillator 180 is driven by the digital to analog converter 185, the oscillation frequency takes a discrete value. When the resolution of this digital to analog converter 185 is low, the output of the digital to analog converter 185 changes greatly if the signal for controlling the digital to analog converter 185 is interfered with disturbance or the like. Along with this, the output frequency of the voltage controlled oscillator 180 may vary greatly. In order to reduce such a variation of the output frequency, it is effective to enhance the resolution of the digital to analog converter 185. By adopting a digital to analog converter 185 of the present invention exemplified by the embodiments shown in FIG. 1, FIG. 2, and FIG. 11, a significant effect of stabilizing the output frequency can be obtained.

As described above in conjunction with FIG. 1, the digital to analog converter of the first embodiment can generate separately the signals for selecting current cells corresponding to an input digital signal, and another digital signal which differs from the former input digital signal by one LSB. Then, in accordance with the change in the output from the delta-sigma modulator, either of the selection signals is selected in order to change the selection of current cells. In this way, it is possible to suppress generation of glitches appearing in the conventional technique due to the difference in the operating time of circuits for generating the selection signals, hence implementing digital to analog conversion of a high resolution.

As described in conjunction with FIG. 2, in the digital to analog converter of the second embodiment, the column decoder is separated into the first and second column decoders as in the row decoders. Then the selection signals output from the first and second column decoders are controlled in accordance with the output from the delta-sigma modulator, thereby to output an analog current corresponding to the two digital signals having a difference of one LSB between them from the current cell array. The analog current is them smoothed and output.

In this way, it is possible to prevent glitches from being generated due to the variation of the delay time of the first and second row decoders thus obtaining highly precise signals.

Also, as shown in FIG. 11, the provision of the latch circuits makes it possible to absorb the delay in response time of the first and second row and column decoders, hence preventing the glitches from being generated due to the delay in the response time of the respective decoder.

Also, the provision of the delay device 200 shown in FIG. 2 makes it possible to allow the first and second row and column decoders, and the selector to operate in synchronism with each other. Further, it is possible to obtain an output voltage corresponding to an input digital signal by adopting the structure of the filter 500 as shown in FIG. 8. Still further, as described in conjunction with FIG. 12, it is possible to enhance the resolution of the digital to analog converter by use of a digital to analog converter exemplified by the first to third embodiments in a frequency synthesizer, thus reducing the variation of the output frequency from the frequency synthesizer.

The present invention is not limited to the embodiments described in conjunction with FIG. 1 to FIG. 12. It should be understood that various modifications are possible in a range without departing from the purpose thereof. For example, in the embodiments of the present invention, the selection signals from the delta-sigma modulator and the first and second line decoders are inputted into the selectors, but the selection signals from the second column decoders may be fed to the current cell array directly. Also, the technique of the present invention of reducing the glitches can be used for a general pulse-width modulation method.

According to the present invention, it is possible to prevent glitches from being generated without influence of change in the output signals from the delta-sigma modulator even if the operating times of the circuits for generating the selection signals of the current cells differ from each other, to enhance the resolution of the output signal from the digital to analog converter using the delta-sigma to reduce the variation of the output frequency of the frequency synthesizer which uses this digital to analog converter. Thus the performance of the frequency synthesizer can be enhanced.

What is claimed is:

1. A digital to analog converter of a current cell matrix type having a current cell array which includes a plurality of current cells including current sources arranged in a matrix and switches for outputting currents from said current sources in response to an input digital signal, wherein a sum of the output currents from said current cells is output as an analog signal, comprising:

a delta sigma modulator which transforms lower n bits of the input digital signal of N bits to a one bit signal sequence by delta sigma modulation and outputs the one bit signal sequence;

a first signal output device which outputs a first signal used for causing switches of first current cells corresponding to the higher (N-n) bits of said input digital signal to output currents from said current sources in said first current cells;

a second signal output device which outputs a second signal used for causing switches of second current cells corresponding to a portion of said input digital signal which differs from said higher (N-n) bits to output currents from said current sources in said second current cells;

a signal selector which selects either said first or second signal output respectively from said first and second signal output devices in accordance with an output from said delta sigma modulator and supplies the selected signal to said switches of the current cells; and a filter which smooths the sum of the output currents of the current cells of said current cell array.

2. A digital to analog converter according to claim 1, further comprising:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

3. A digital to analog converter according to claim 2, wherein said filter is provided with a current to voltage converter for converting the sum of the output currents from said current cell array to a voltage.

4. A digital to analog converter according to claim 1, wherein said filter is provided with a current to voltage converter for converting the sum of the output currents from said current cell array to a voltage.

5. A digital to analog converter of a current cell matrix type having a current cell array which includes a plurality of current cells including current sources arranged in a matrix and switches for outputting currents from said current sources in response to an input digital signal when said current cells are in an output state, and wherein a sum of output currents from said current cells is output as an analog signal, comprising:

a delta sigma modulator which transforms lower n bits of the input digital signal of N bits to a one bit signal sequence by delta sigma modulation and outputs the one bit signal sequence;

a first row decoder which decodes higher m bits of said higher (N-n) bits of the input digital signal and outputs a row selection signal for selecting one row in said current cell array corresponding to a number represented by said higher m-bits;

a second row decoder which decodes said higher m bits and outputs a row output state setting signal for causing current cells in all rows of said current cell array corresponding to a number less than the number represented by said higher m bits to be in the output state;

a first column decoder which decodes lower (N-n-m) bits of the higher (N-n) bits of the input digital signal, and outputs a column selection signal for selecting one column of said current cell array corresponding to a number represented by said lower (N-n-m) bits, thereby causing current cells of said current cell array on the column selected by said column selection signal and on the row selected by the row selection signal to be in the output state;

a second column decoder which decodes the lower (N-n-m) bits, and outputs an all column selection signal for selecting current cells of all the columns of said current cell array corresponding to a number less than the number represented by said lower (N-n-m) bits, thereby causing current cells of said current cell array on the columns selected by said all column selection signal and on the row selected by the row selection signal to be in the output state;

a selector which outputs the column selection signal output from said first column decoder to said current cell array or outputs the sum of the column selection signals output from the first and second column decoders to said current cell array based on the output from said delta sigma modulator; and a filter which smooths the sum of the output currents of the current cells of said current cell array in the output state.

6. A digital to analog converter according to claim 5, further comprising:

a synchronizing controller which synchronizes timing of supplying the output signals from said first and second row decoders, and said first and second column decoders to said current cell array.

7. A digital to analog converter according to claim 6, further comprising:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

8. A digital to analog converter according to claim 7, wherein said filter is provided with a current to voltage converter for converting the sum of the output currents from said current cell array to a voltage.

9. A digital to analog converter according to claim 6, wherein said filter is provided with a current to voltage converter for converting the sum of the output currents from said current cell array to a voltage.

10. A digital to analog converter according to claim 5, further comprising:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

11. A digital to analog converter according to claim 10, wherein said filter is provided with a current to voltage converter for converting the sum of the output currents from said current cell array to a voltage.

12. A digital to analog converter according to claim 5, wherein said filter is provided with a current to voltage converter for converting the sum of the output currents from said current cell array to a voltage.

13. A frequency synthesizer comprising:

a voltage controlled oscillator which provides an oscillating output at a frequency corresponding to a value of an input analog voltage;

a divider which divides the frequency of the oscillating output of said voltage controlled oscillator;

a phase comparator which outputs a digital signal corresponding to the phase difference between the output of said divider and a reference signal;

a digital filter which removes unwanted high frequency components included in the output of said phase comparator; and a digital to analog converter which drives said voltage controlled oscillator by converting the output of said digital filter to an analog voltage, wherein said digital to analog converter is a current cell matrix type having a current cell array which includes a plurality of current cells including current sources arranged in a matrix and switches for outputting currents from said current sources in response to an input digital signal, and wherein a sum of the output currents from said current cells is output as an analog signal, and wherein said digital to analog converter comprises:

a delta sigma modulator which transforms lower n bits of the input digital signal of N bits to a one bit signal sequence by delta sigma modulation and outputs the one bit signal sequence, a first signal output device which outputs a first signal used for causing switches of first current cells corresponding to the higher (N-n) bits of said input digital signal to output currents from said current sources in said first current cells, a second signal output device which outputs a second signal used for causing switches of second current cells corresponding to a portion of said input digital signal which differs from said higher (N-n) bits to output currents from said current sources in said second current cells, a signal selector which selects either said first or second signal output respectively from said first and second signal output devices in accordance with an output from said delta sigma modulator and supplies the selected signal to said switches of the current cells, and a filter which smooths the sum of the output currents of the current cells of said current cell array.

14. A frequency synthesizer according to claim 13, wherein said digital to analog converter further comprises:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

15. A frequency synthesizer according to claim 14, wherein said filter is provided with a current to voltage converter for converting the sum of the output currents from said current cell array to a voltage.

16. A frequency synthesizer according to claim 13, wherein said filter is provided with a current to voltage converter for converting the sum of the output currents from said current cell array to a voltage.

17. A frequency synthesizer comprising:

a voltage controlled oscillator which provides an oscillating output at a frequency corresponding to a value of an input analog voltage;

a divider which divides the frequency of the oscillating output of said voltage controlled oscillator;

a phase comparator which outputs a digital signal corresponding to the phase difference between the output of said divider and a reference signal;

a digital filter which removes unwanted high frequency components included in the output of said phase comparator; and a digital to analog converter which drives said voltage controlled oscillator by converting the output of said digital filter to an analog voltage, wherein said digital to analog converter is a current cell matrix type having a current cell array which includes a plurality of current cells including current sources arranged in a matrix and switches for outputting currents from said current sources in response to an input digital signal when said current cells are in an output state, and wherein a sum of output currents from said current cells is output as an analog signal, and wherein said digital to analog converter comprises:

a delta sigma modulator which transforms lower n bits of the input digital signal of N bits to a one bit signal sequence by delta sigma modulation and outputs the one bit signal sequence, a first row decoder which decodes higher m bits of said higher (N-n) bits of the input digital signal and outputs a row selection signal for selecting one row in said current cell array corresponding to a number represented by said higher m-bits, a second row decoder which decodes said higher m bits and outputs a row output state setting signal for causing current cells in all rows of said current cell array corresponding to a number less than the number represented by said higher m bits to be in the output state, a first column decoder which decodes lower (N-n-m) bits of the higher (N-n) bits of the input digital signal, and outputs a column selecting signal for selecting one column of said current cell array corresponding to a number represented by said lower (N-n-m) bits, thereby causing current cells of said current cell array on the column selected by said column selection signal and on the row selected by the row selection signal to be in the output state, a second column decoder which decodes the lower (N-n-m) bits, and outputs an all column selection signal for selecting current cells of all the columns of said current cell array corresponding to a number less than the number represented by said lower (N-n-m) bits, thereby causing current cells of said current cell array on the columns selected by said all column selection signal and on the row selected by the row selection signal to be in the output state, a selector which outputs the column selection signal output from said first column decoder to said current cell array or outputs the sum of the column selection signals output from the first and second column decoders to said current cell array based on the output from said delta sigma modulator, and a filter which smooths the sum of the output currents of the current cells of said current cell array in the output state.

18. A frequency synthesizer according to claim 17, wherein said digital to analog converter further comprises:

a synchronizing controller which synchronizes timing of supplying the output signals from said first and second row decoders, and said first and second column decoders to said current cell array.

19. A frequency synthesizer according to claim 18, wherein said digital to analog converter further comprises:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

20. A frequency synthesizer according to claim 19, wherein said filter is provided with a current to voltage converter for converting the sum of the output currents from said current cell array to a voltage.

21. A frequency synthesizer according to claim 18, wherein said filter is provided with a current to voltage converter for converting the sum of the output currents from said current cell array to a voltage.

22. A frequency synthesizer according to claim 17, wherein said digital to analog converter further comprises:

a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

23. A frequency synthesizer according to claim 22, wherein said filter is provided with a current to voltage converter for converting the sum of the output currents from said current cell array to a voltage.

24. A frequency synthesizer according to claim 17, wherein said filter is provided with a current to voltage converter for converting the sum of the output currents from said current cell array to a voltage.

25. A digital to analog converter of a current cell matrix type having a current cell array which includes a plurality of current cells including current sources arranged in a matrix and switches for outputting currents from said current sources in response to an input digital signal when said current cells are in an output state, and wherein a sum of output currents from said current cells is output as an analog signal, comprising:

a delta sigma modulator which transforms lower n bits of the input digital signal of N bits to a one bit signal sequence by delta sigma modulation and outputs the one bit signal sequence;

a first row decoder which decodes higher m bits of said higher (N-n) bits of the input digital signal and outputs a row selection signal for selecting one row in said current cell array corresponding to a number represented by said higher m-bits;

a second row decoder which decodes said higher m bits and outputs a row output state setting signal for causing current cells in all rows of said current cell array corresponding to a number less than the number represented by said higher m bits to be in the output state;

a first column decoder which decodes lower (N-n-m) bits of the higher (N-n) bits of the input digital signal, and outputs an all column selection signal for selecting all columns of said current cell array corresponding to a number represented by said lower (N-n-m) bits, thereby causing current cells of said current cell array on the columns selected by said all column selection signal and on the row selected by the row selection signal to be in the output state;

a second column decoder which decodes the lower (N-n-m) bits, and outputs an all column selection signal for selecting current cells of all the columns of said current cell array corresponding to a number less than the number represented by said lower (N-n-m) bits thereby causing current cells of said current cell array on the columns selected by said all column selection signal and on the row selected by the row selection signal to be in the output state;

a selector which outputs the all column selection signal output from said first column decoder to said current cell array or outputs the all column selection signal from the second column decoder to said current cell array based on the output from said delta sigma modulator; and a filter which smooths the sum of the output currents of the current cells of said current cell array in the output state.

26. A digital to analog converter according to claim 25, further comprising:

a synchronizing controller which synchronizes timing of supplying the output signals from said first and second row decoders, and said first and second column decoders to said current cell array.

27. A digital to analog converter according to claim 26, further comprising:
a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

28. A digital to analog converter according to claim 27, wherein said filter is provided with a current to voltage converter for converting the sum of the output currents from said current cell array to a voltage.

29. A digital to analog converter according to claim 26, wherein said filter is provided with a current to voltage converter for converting the sum of the output currents from said current cell array to a voltage.

30. A digital to analog converter according to claim 25 further comprising:
a delay circuit which delays the input of the higher (N-n) bits of said input digital signal for a period equal to a delay between the input of the lower n bits of the input digital signal to said delta sigma modulator and the output of the one bit signal sequence from said sigma modulator.

31. A digital to analog converter according to claim 30, wherein said filter is provided with a current to voltage converter for converting the sum of the output currents from said current cell array to a voltage.

32. A digital to analog converter according to claim 25, wherein said filter is provided with a current to voltage converter for converting the sum of the output currents from said current cell array to a voltage.

33. A frequency synthesizer comprising:
a voltage controlled oscillator which provides an oscillating output at a frequency corresponding to a value of an input analog voltage;
a divider which divides the frequency of the oscillating output of said voltage controlled oscillator;
a phase comparator which outputs a digital signal corresponding to the phase difference between the output of said divider and a reference signal;
a digital filter which removes unwanted high frequency components included in the output of said phase comparator; and
a digital to analog converter which drives said voltage controlled oscillator by converting the output of said digital filter to an analog voltage,
wherein said digital to analog converter is a current cell matrix type having a current cell array which includes a plurality of current cells including current sources arranged in a matrix and switches for outputting currents from said current sources in response to an input digital signal when said current cells are in an output state, and wherein a sum of output currents from said current cells is output as an analog signal, and
wherein said digital to analog converter comprises:
a delta sigma modulator which transforms lower n bits of the input digital signal of N bits to a one bit signal sequence by delta sigma modulation and outputs the one bit signal sequence,
a first row decoder which decodes higher m bits of said higher (N-n) bits of the input digital signal and outputs a row selection signal for selecting one row in said current cell array corresponding to a number represented by said higher m-bits,
a second row decoder which decodes said higher m bits and outputs a row output state setting signal for causing current cells in all rows of said current cell array corresponding to a number less than the number represented by said higher m bits to be in the output state,
a first column decoder which decodes lower (N-n-m) bits of the higher (N-n) bits of the input digital signal, and outputs an all column selection signal for selecting all columns of said current cell array corresponding to a number represented by said lower (N-n-m) bits, thereby causing current cells of said current cell array on the columns selected by said all column selection signal and on the row selected by the row selection signal to be in the output state,
a second column decoder which decodes the lower (N-n-m) bits, and outputs an all column selection signal for selecting current cells of all the columns of said current cell array corresponding to a number less than the number represented by said lower (N-n-m) bits, thereby causing current cells of said current cell array on the columns selected by said all column selection signal and on the row selected by the row selection signal to be in the output state,
a selector which outputs the all column selection signal output from said first column decoder to said current cell array or outputs the all column selection signal from the second column decoder to said current cell array based on the output from said delta sigma modulator, and
a filter which smooths the sum of the output currents of the current cells of said current cell array in the output state.

34. A frequency synthesizer according to claim 33, wherein said digital to analog converter further comprises:
a synchronizing controller which synchronizes timing of supplying the output signals from said first and second row decoders, and said first and second column decoders to said current cell array.

35. A frequency synthesizer according to claim 34, wherein said digital to analog converter further comprises:
a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

36. A frequency synthesizer according to claim 35, wherein said filter is provided with a current to voltage converter for converting the sum of the output currents from said current cell array to a voltage.

37. A frequency synthesizer according to claim 34, wherein said filter is provided with a current to voltage converter for converting the sum of the output currents from said current cell array to a voltage.

38. A frequency synthesizer according to claim 33, wherein said digital to analog converter further comprises:
a delay circuit which delays the input of the higher (N-n) bits of said input digital signal for a period equal to a delay between the input of the lower n bits of the input digital signal to said delta sigma modulator and the output of the one bit signal sequence from said delta sigma modulator.

39. A frequency synthesizer according to claim 38, wherein said filter is provided with a current to voltage converter for converting the sum of the output currents from said current cell array to a voltage.

40. A frequency synthesizer according to claim 33, wherein said filter is provided with a current to voltage converter for converting the sum of the output currents from said current cell array to a voltage.

41. A method of converting an input digital signal to an analog signal, comprising the steps of:

transforming lower n bits of the input digital signal of N bits to a one bit signal sequence by delta sigma modulation;

outputting a first signal used for causing switches of first current cells corresponding to the higher (N-n) bits of said input digital signal to output currents from current sources in said first current cells;

outputting a second signal used for causing switches of second current cells corresponding to a portion of said input digital signal which differs from said higher (N-n) bits to output currents from current sources in said second current cells;

selecting either said first or second signal in accordance with said one bit signal sequence obtained by said transforming step and supplying the selected signal to said switches of said current cells; and smoothing a sum of the currents output from said current cells of said current cell array.

42. A method according to claim 41, further comprising the step of:

delaying the input of the higher (N-n) bits of said input digital signal for a period equal to a delay between the input of the lower n bits of the input digital signal to step (a) and the output of the one bit signal sequence from step (a).

43. A method according to claim 42, wherein said smoothing step is performed by a filter which is provided with a current to voltage converter for converting the sum of the output currents from said current cell array to a voltage.

44. A method according to claim 41, wherein said smoothing step is performed by a filter which is provided with a current to voltage converter for converting the sum of the output currents from said current cell array to a voltage.

45. A method of converting an input digital signal to an analog signal, comprising the steps of:

(a) transforming lower n bits of the input digital signal of N bits to a one bit signal sequence by delta sigma modulation;

(b) decoding higher m bits of said higher (N-n) bits of the input digital signal so as to output a row selection signal for selecting one row in a current cell array corresponding to a number represented by said higher m-bits;

(c) decoding said higher m bits so as to output a row output state setting signal for causing current cells in all rows of said current cell array corresponding to a number less than the number represented by said higher m bits to be in the output state;

(d) decoding lower (N-n-m) bits of the higher (N-n) bits of the input digital signal so as to output a column selection signal for selecting one column of said current cell array corresponding to a number represented by said lower (N-n-m) bits, thereby causing current cells of said current cell array on the column selected by said column selection signal and on the row selected by the row selection signal to be in the output state;

(e) decoding the lower (N-n-m) bits so as to output an all column selection signal for selecting current cells of all the columns of said current cell array corresponding to a number less than the number represented by said lower (N-n-m) bits thereby causing current cells of said current cell array on the columns selected by said all column selection signal and on the row selected by the row selection signal to be in the output state;

(f) outputting the column selection signal output from said first column decoder to said current cell array or outputting the sum of the column selection signals output from the first and second column decoders to said current cell array based on said one bit signal sequence obtained from step (a); and (g) smoothing a sum of the currents output from said current cells of said current cell array in the output state.

46. A method according to claim 45, further comprising the steps of:

synchronizing timing of supplying of output signals from steps (b) and (c) and steps (d) and (e) to said current cell array.

47. A method according to claim 46, wherein step (g) is performed by a filter which is provided with a current to voltage converter for converting the sum of the output currents from said current cell array to a voltage.

48. A method according to claim 45, further comprising the steps of:

delaying the input of the higher (N-n) bits of said input digital signal for a period equal to a delay between the input of the lower n bits of the input digital signal to step (a) and the output of the one bit signal sequence from step (a).

49. A method according to claim 48, wherein step (g) is performed by a filter which is provided with a current to voltage converter for converting the sum of the output currents from said current cell array to a voltage.

50. A method according to claim 45, wherein step (g) is performed by a filter which is provided with a current to voltage converter for converting the sum of the output currents from said current cell array to a voltage.

51. A method of synthesizing a frequency comprising the steps of:

providing, by a voltage controlled oscillator, an oscillating output at a frequency corresponding to a value of an input analog voltage;

dividing the frequency of the oscillating output;

outputting a digital signal corresponding to the phase difference between the divided frequency and a reference signal;

filtering said digital signal by removing unwanted high frequency components included in said digital signal; and converting the filtered digital signal to an analog voltage, wherein said converting step comprises the steps of:

transforming lower n bits of the input digital signal of N bits to a one bit signal sequence by delta sigma modulation, outputting a first signal used for causing switches of first current cells corresponding to the higher (N-n) bits of said input digital signal to output currents from current sources in said first current cells, outputting a second signal used for causing switches of second current cells corresponding to a portion of said input digital signal which differs from said higher (N-n) bits to output currents from current sources in said second current cells, selecting either said first or second signal in accordance with said one bit signal sequence obtained by said transforming step and supplying the selected signal to said switches of said current cells, and smoothing a sum of the currents output from current cells of said current cell array.

52. A method according to claim 51, wherein said digital to analog converting step further comprises the step of:

delaying the input of the higher (N-n) bits of said input digital signal for a period equal to a delay between the input of the lower n bits of the input digital signal to said transforming step and the output of sequence from said transforming step.

53. A method according to claim 52, wherein said smoothing step is performed by a filter which is provided with a current to voltage converter for converting the sum of the output currents from said current cell array to a voltage.

54. A method according to claim 51, wherein said smoothing step is performed by a filter which is provided with a current to voltage converter for converting the sum of the output currents from said current cell array to a voltage.

55. A method of synthesizing a frequency comprising the steps of:

providing, by a voltage controlled oscillator, an oscillating output at a frequency corresponding to a value of an input analog voltage;

dividing the frequency of the oscillating output of said voltage controlled oscillator;

outputting a digital signal corresponding to the phase difference between the divided frequency and a reference signal;

filtering said digital signal by removing unwanted high frequency components included in said digital signal; and converting the filtered digital signal input from the filtering step to an analog voltage which is used to drive said voltage controlled oscillator, wherein said converting step comprises the steps of:

(a) transforming lower n bits of the input digital signal of N bits to a one bit signal sequence by delta sigma modulation, (b) decoding higher m bits of said higher (N-n) bits of the input digital signal so as to output a row selection signal for selecting one row in said current cell array corresponding to a number represented by said higher m-bits, (c) decoding said higher m bits so as to output a row output state setting signal for causing current cells in all rows of said current cell array corresponding to a number less than the number represented by said higher m bits to be in the output state, (d) decoding lower (N-n-m) bits of the higher (N-n) bits of the input digital signal so as to output a column selection signal for selecting one column of said current cell array corresponding to a number represented by said lower (N-n-m) bits, thereby causing current cells of said current cell array on the column selected by said column selection signal and on the row selected by the row selection signal to be in the output state, (e) decoding the lower (N-n-m) bits so as to output an all column selection signal for selecting current cells of all the columns of said current cell array corresponding to a number less than the number represented by said lower (N-n-m) bits, thereby causing current cells of said current cell array on the columns selected by said all column selection signal and on the row selected by the row selection signal to be in the output state, (f) outputting the column selection signal output from said first column decoder to said current cell array or outputting the sum of the column selection signals output from the first and second column decoders to said current cell array based on said one bit signal sequence obtained from step (a), and (g) smoothing a sum of the currents output from said current cells of said current cell array in the output state.

56. A method according to claim 55, wherein said converting step further comprises the step of:

synchronizing timing of supplying of output signals from steps (b) and (c) and steps (d) and (e) to said current cell array.

57. A frequency synthesizer according to claim 56, wherein said converting step further comprises the step of:

delaying the input of the higher (N-n) bits of said input digital signal for a period equal to a delay between the input of the lower n bits of the input digital signal to step (a) and the output of the one bit signal sequence from step (a).

58. A method according to claim 57, wherein step (g) is performed by a filter which is provided with a current to voltage converter for converting the sum of the output currents from said current cell array to a voltage.

59. A method according to claim 56, wherein step (g) is performed by a filter which is provided with a current to voltage converter for converting the sum of the output currents from said current cell array to a voltage.

60. A method according to claim 55, wherein said converting step further comprises the step of:

delaying the input of the higher (N-n) bits of said input digital signal for a period equal to a delay between the input of the lower n bits of the input digital signal to (step (a) and the output of the one bit signal sequence from step (a).

61. A method according to claim 60, wherein step (g) is performed by a filter which is provided with a current to voltage converter for converting the sum of the output currents from said current cell array to a voltage.

62. A method according to claim 55, wherein step (g) is performed by a filter which is provided with a current to voltage converter for converting the sum of the output currents from said current cell array to a voltage.

63. A method of converting an input digital signal to an analog signal, comprising the steps of:

(a) transforming lower n bits of the input digital signal of N bits to a one bit signal sequence by delta sigma modulation, (b) decoding higher m bits of said higher (N-n) bits of the input digital signal so as to output a row selection signal for selecting one row in a current cell array corresponding to a number represented by said higher m-bits;

(c) decoding said higher m bits so as to output a row output state setting signal for causing current cells in all rows of said current cell array corresponding to a number less than the number represented by said higher m bits to be in the output state;

(d) decoding lower (N-n-m) bits of the higher (N-n) bits of the input digital signal so as to output an all column selection signal for selecting all columns of said current cell array corresponding to a number represented by said lower (N-n-m) bits, thereby causing current cells of said current cell array on the columns selected by said all column selection signal and on the row selected by the row selection signal to be in the output state;

(e) decoding the lower (N-n-m) bits so as to output an all column selection signal for selecting current cells of all the columns of said current cell array corresponding to a number less than the number represented by said lower (N-n-m) bits thereby causing current cells of said current cell array on the columns selected by said all column selection signal and on the row selected by the row selection signal to be in the output state;

(f) outputting the all column selection signal output from said first column decoder to said current cell array or outputting the all column selection signal from the second column decoder to said current cell array based on said one bit signal sequence for step (a); and (g) smoothing a sum of the output currents output from said current cells of said current cell array in the output state.

64. A method according to claim 63, further comprising the step of:

synchronizing timing of supplying of the output signals from steps (b) and (c) and steps (d) and (e) to said current cell array.

65. A method according to claim 64, further comprising the step of:

delaying the input of the higher (N-n) bits of said input digital signal for a period equal to a delay between the input of the lower n bits of the input digital signal to step (a) and the output of the one bit signal sequence from step (a).

66. A method according to claim 65, wherein step (g) is performed by a filter which is provided with a current to voltage converter for converting the sum of the output currents from said current cell array to a voltage.

67. A method according to claim 64, wherein step (g) is performed by a filter which is provided with a current to voltage converter for converting the sum of the output currents from said current cell array to a voltage.

68. A method according to claim 63, further comprising the step of:

delaying the input of the higher (N-n) bits of said input digital signal for a period equal to a delay between the input of the lower n bits of the input digital signal to step (a) and the output of the one bit signal sequence from step (a).

69. A method according to claim 68, wherein step (g) is performed by a filter which is provided with a current to voltage converter for converting the sum of the output currents from said current cell array to a voltage.

70. A method according to claim 63, wherein step (g) is performed by a filter which is provided with a current to voltage converter for converting the sum of the output currents from said current cell array to a voltage.

71. A method of synthesizing a frequency comprising the steps of:

providing, by a voltage controlled oscillator, an oscillating output at a frequency corresponding to a value of an input analog voltage;

dividing the frequency of the oscillating output of said voltage controlled oscillator;

outputting a digital signal corresponding to the phase difference between the divided frequency and a reference signal;

filtering said digital signal by removing unwanted high frequency components included in the output of said digital signal; and converting the filtered digital signal input from the filtering step to an analog voltage which is used to drive said voltage controlled oscillator, wherein said converting step comprises the steps of:

(a) transforming lower n bits of the input digital signal of N bits to a one bit signal sequence by delta sigma modulation, (b) decoding higher m bits of said higher (N-n) bits of the input digital signal so as to output a row selection signal for selecting one row in said current cell array corresponding to a number represented by said higher m-bits, (c) decoding said higher m bits so as to output a row output state setting signal for causing current cells in all rows of said current cell array corresponding to a number less than the number represented by said higher m bits to be in the output state, (d) decoding lower (N-n-m) bits of the higher (N-n) bits of the input digital signal so as to output an all column selection signal for selecting all columns of said current cell array corresponding to a number represented by said lower (N-n-m) bits, thereby causing current cells of said current cell array on the columns selected by said all column selection signal and on the row selected by the row selection signal to be in the output state, (e) decoding the lower (N-n-m) bits so as to output an all column selection signal for selecting current cells of all the columns of said current cell array corresponding to a number less than the number represented by said lower (N-n-m) bits, thereby causing current cells of said current cell array on the columns selected by said all column selection signal and on the row selected by the row selection signal to be in the output state, (f) outputting a selector which outputs the all column selection signal output from said first column decoder or outputting the sum of the column selection signals output from the first and second column decoders to said current cell array based on said one bit signal sequence obtained from step (a), and (g) smoothing a sum of the currents output from said current cells of said current cell array in the output state.

72. A method according to claim 71, wherein said converting step further comprises the step of:

(h) synchronizing timing of supplying of the output signals from steps (b) and (c) and steps (d) and (e) to said current cell array.

73. A method according to claim 72, wherein said converting step further comprises the step of:

delaying the input of the higher (N-n) bits of said input digital signal for a period equal to a delay between the input of the lower n bits of the input digital signal to step (a) and the output of the one bit signal sequence from step (a).

74. A method according to claim 73, wherein step (g) is performed by a filter which is provided with a current to voltage converter for converting the sum of the output currents from said current cell array to a voltage.

75. A method according to claim 72, wherein step (g) is performed by a filter which is provided with a current to voltage converter for converting the sum of the output currents from said current cell array to a voltage.

76. A method according to claim 71, wherein said converting step further comprises the step of:

delaying the input of the higher (N-n) bits of said input digital signal for a period equal to a delay between the input of the lower n bits of the input digital signal to step (a) and the output of the one bit signal sequence from step (a).

77. A method according to claim 76, wherein step (g) is performed by a filter which is provided with a current to voltage converter for converting the sum of the output currents from said current cell array to a voltage.

78. A method according to claim 71, wherein step (g) is performed by a filter which is provided with a current to voltage converter for converting the sum of the output currents from said current cell array to a voltage.

* * * * *